United States Patent [19]

Ishizuka et al.

[11] Patent Number: 5,436,724
[45] Date of Patent: Jul. 25, 1995

[54] APPARATUS FOR MEASURING RELATIVE MOVEMENT USING A DIFFRACTION GRATING HAVING AN ORTHOGONALLY POLARIZED INPUT BEAM

[75] Inventors: Koh Ishizuka, Urawa; Tetsuharu Nishimura, Kawasaki, both of Japan

[73] Assignee: Canon Kabushiki Kaisha, Tokyo, Japan

[21] Appl. No.: 956,059

[22] Filed: Oct. 2, 1992

[30] Foreign Application Priority Data

| Oct. 3, 1991 | [JP] | Japan | 3-283580 |
| Oct. 3, 1991 | [JP] | Japan | 3-283581 |
| Oct. 3, 1991 | [JP] | Japan | 3-283582 |
| Oct. 3, 1991 | [JP] | Japan | 3-283583 |
| Oct. 3, 1991 | [JP] | Japan | 3-283584 |
| Jun. 2, 1992 | [JP] | Japan | 4-167015 |

[51] Int. Cl.$^6$ .............................................. G01B 9/02
[52] U.S. Cl. .................................... 356/356; 356/351; 250/237 G
[58] Field of Search ............... 356/356, 354, 349, 351, 356/345, 358; 250/237 G, 231.14

[56] References Cited

U.S. PATENT DOCUMENTS

| 4,652,129 | 3/1987 | Martinelli | 356/351 |
| 4,912,530 | 3/1990 | Bessho | 356/349 |
| 4,948,251 | 8/1990 | Kondo | 356/356 |
| 5,000,573 | 3/1991 | Suzuki et al. | 356/349 |
| 5,067,813 | 11/1991 | Ishizuka et al. | 356/356 |
| 5,126,562 | 6/1992 | Ishizuka et al. | 250/231.14 |
| 5,146,085 | 9/1992 | Ishizuka et al. | 356/356 |
| 5,182,610 | 1/1993 | Shibata | 356/356 |

FOREIGN PATENT DOCUMENTS 2598797 11/1987 France ............................. 356/349

OTHER PUBLICATIONS

IBM Technical Disclosure Bulletin, vol. 32, No. 10B, Mar. 1990, "Interferometric Method of Checking the Overlay Accuracy in Photolithographic Exposure Processes".

*Primary Examiner*—Samuel A. Turner
*Attorney, Agent, or Firm*—Fitzpatrick, Cella, Harper & Scinto

[57] ABSTRACT

An apparatus for measuring relative movement by the use of a diffraction grating includes a light beam generating portion generating a light beam including light wave components having planes of polarization orthogonal to each other, an interference optical system for directing the light beam from the light beam generating portion to the diffraction grating, the light beam directed by the interference optical system being diffracted by the diffraction grating to thereby at least create two diffracted light beams of different orders having planes of polarization orthogonal to each other, the interference optical system being disposed so as to superpose the two diffracted lights one upon the other or upon other light and cause them to interfere with each other, and a detecting system for detecting the interfering light beams from the interference optical system. The relative movement of the diffraction grating and the interference optical system is measured by the detection by the detecting system. The interference optical system has in at least a portion of the optical path from the diffraction grating to the detecting system a polarization maintaining optical fiber for propagating the two diffracted light beams therethrough.

10 Claims, 20 Drawing Sheets

5,436,724

APPARATUS FOR MEASURING RELATIVE MOVEMENT USING A DIFFRACTION GRATING HAVING AN ORTHOGONALLY POLARIZED INPUT BEAM

BACKGROUND OF THE INVENTION

1. Field of the Invention

This invention relates to an encoder, and particularly to an encoder such as a rotary encoder or a linear encoder which causes a coherent light beam such as a laser beam to enter a minute grating array such as a diffraction grating mounted on a moving object (scale), causes diffracted light of a predetermined order from the diffraction grating to interfere with each other to thereby form interference fringes, and measures the movement information of the diffraction grating, i.e., the movement information of the moving object, by the use of the fringes of light and shade of the interference fringes.

2. Related Background Art

There are encoders and measuring apparatuses which can measure movement information such as the amount and direction of movement of a moving object in an NC machine tool or the like highly accurately, e.g. at the level of a submicron, and such encoders are used in various fields.

Particularly as an encoder of high accuracy and high resolving power, there is well known an encoder of the diffracted light interference type which causes a coherent light beam such as a laser beam to enter a diffraction grating provided on a moving object, causes diffracted light of a predetermined order created from the diffraction grating to interfere with each other to thereby form interference fringes, and counts the light and shade portions of the interference fringes to thereby find the state of movement such as the amount and direction of movement of the moving object.

FIG. 1A of the accompanying drawings is a schematic view of the essential portions of a linear encoder of the diffracted light interference type according to the prior art.

In FIG. 1A, a monochromatic light beam emitted from a light source 1 is caused to enter a minute grating array 5 of a grating pitch P comprising diffraction gratings on a scale 5a to thereby create a plurality of diffracted light beams. At this time, with the order of the rectilinearly travelling light beam as 0, diffracted lights of orders such as ±1, ±2, ±3, . . . are defined on both sides thereof and further, the direction of movement of the scale 5a is given the sign + and the direction opposite thereto is given the sign −, thereby distinguishing between them. Thereupon, the phase of the wave surface of nth-order diffracted light has the property of deviating with respect to the wave surface of 0-order light by $2\pi \cdot n \cdot X/P$, where X is the amount of movement of the scale 5a.

So, diffracted light of different orders have the phases of their wave surfaces deviated from one another and therefore, if the optical paths of two diffracted light beams are superposed one upon the other and caused to interfere with each other by a suitable optical system, there will be obtained light and shade signals.

If for example, +1st-order diffracted light and −1st-order diffracted light are superposed one upon the other and caused to interfere with each other by the use of mirrors 9a and 9b and a beam splitter 3, the phases thereof will deviate from each other by $4\pi$ while the scale 5a moves by an amount corresponding to one pitch of the minute gratings and therefore, there will occur a variation of two periods in the quantity of light and shade. Accordingly, if the variation in the quantity of light and shade at this time is detected, the amount of movement of the scale 5a can be found.

FIG. 1B of the accompanying drawings is a schematic view of the essential portions of a linear encoder of the diffracted light interference type according to the prior art which is designed to detect not only the amount of movement of the scale 5a but also the direction of movement of the scale 5a.

In FIG. 1B, as compared with the encoder of FIG. 1A, there are prepared at least two kinds of light and shade signals obtained from two diffracted light beams resulting from the movement of the scale 5a, and the timings of the light and shade thereof deviate from each other to thereby detect the direction of movement of the scale 5a.

That is, in FIG. 1B, before nth-order diffracted light and mth-order diffracted light created from the minute grating array 5 are superposed one upon the other, polarizing plates 8a, 8b or the like are utilized to make that light into linearly polarized light beams whose planes of polarization are orthogonal to each other. The optical paths of these light beams are superposed one upon the other through mirrors 9a, 9b and a beam splitter 3a, and then are transmitted through a quarter wavelength plate 7a and are converted into linearly polarized light the azimuth of whose plane of polarization is determined by the phase difference between the two light beams.

Further it is divided into two light beams by a non-polarizing beam splitter 3b, and the respective light beams are transmitted through polarizing plates (analyzers) 8c and 8d disposed so that the azimuths of polarization (the azimuths of linearly polarized lights which can be transmitted) may deviate from each other, and two kinds of light and shade signals in which the timings of light and shade by the interference between the two light beams deviate from each other are detected by detectors 10a and 10b.

If for example, the azimuths of polarization of these two polarizing plates deviate by 45° from each other, the timing of light and shade will deviate by 90° ($\pi/2$) when expressed in terms of phase. The encoder of FIG. 1B detects movement information including the direction of movement of the scale 5a by the use of the signals from the two detectors 10a and 10b at this time, Generally an encoder of the diffracted light interference type is capable of effecting detection of a high resolving power, but in compensation for reading a minute grating array with high resolving power, the frequency of the signal of the encoder readily deviates by the order of several MHz due to a slight movement or rotation of a scale. This has led to the tendency toward the amplification of an electrical signal, and the bulkiness of a processing portion of the device and the disadvantage that the signal can become weak due to noise.

There has also been a problem that a semiconductive element such as a laser diode used as the light source, a light receiving element and an electrical circuit are limited in a high use in heat environment and a strong electromagnetic field environment (noise environment).

In contrast, there is a method of utilizing optical fiber to construct a light source and a light receiving element in segregated relationship with a moving object (under the environment of an object to be measured). In this case, there are required at least one fiber for light projection and two fibers for light reception.

Generally, a three-dimensional precise aligning structure of the order of a micron becomes necessary at the location of incidence of a light beam onto an optical fiber (the connector portion). Therefore, the use of a plurality of optical fibers has led to a problem that the entire apparatus becomes complicated and bulky.

In contrast, it is desirable that an encoder be constructed of one optical fiber, but for example, to construct an encoder of the diffracted light interference type by the use of one optical fiber, there is a problem that a light beam must be transmitted through the optical fiber so that there may be obtained signals of at least two phases which are out of phase with respect to each other, and this has been difficult to realize.

SUMMARY OF THE INVENTION

It is an object of the present invention to provide an encoder which can efficiently direct light beams from a diffraction grating the directions of whose planes of polarization are orthogonal to each other by a fiber and which can detect the movement information of a scale (a moving object) highly accurately while achieving the simplification of the entire apparatus, without being affected by a high heat environment.

It is also an object of the present invention to provide an encoder which utilizes the heterodyne interference method and which can efficiently direct light beams from a diffraction grating the directions of whose planes of polarization are orthogonal to each other by a fiber so that the loss of light may become small and can detect the movement information of a scale (a moving object) highly accurately while achieving the simplification of the entire apparatus without being affected by a high heat environment.

Other objects of the present invention will become apparent from the following description of the embodiments of the invention.

DESCRIPTION OF THE PREFERRED EMBODIMENTS

Figure 1A:
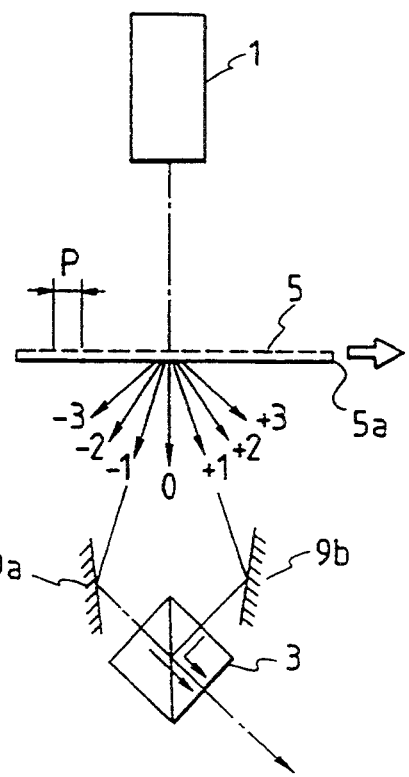
FIG. 1A is a schematic view of the essential portions of an encoder of the diffracted light interference type according to the prior art.
Figure 1B:
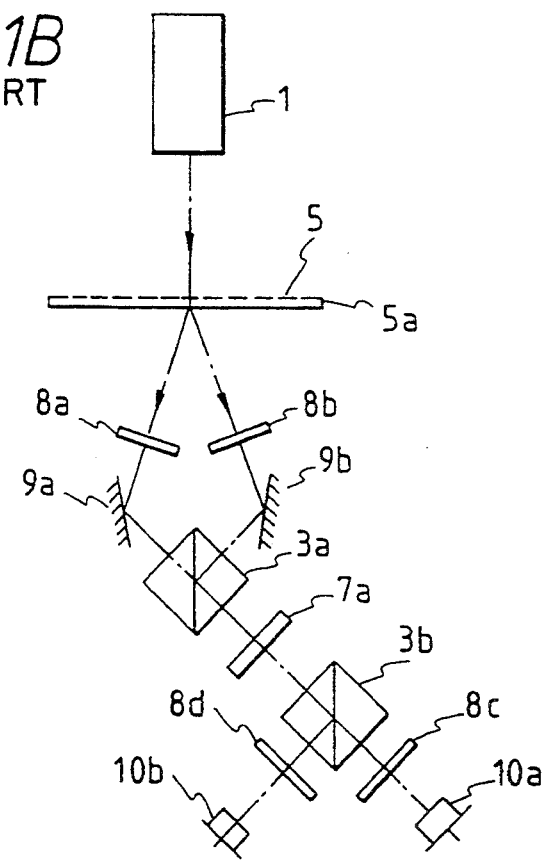
FIG. 1B is a schematic view of the essential portions of an encoder of the diffracted light interference type according to the prior art.

The embodiments of the present invention will hereinafter be described.

(1-A) In an encoder wherein a light beam from light source means is applied to the minute grating array of a scale provided with a minute grating array through optical means, two diffracted light beams of different orders created from the minute grating array are taken out through a detecting optical system and a portion of the optical means and are superposed one upon the other and caused to interfere with each other, the light and shade signal of the light beam based on the interference is detected by photoelectric converting means and the relative movement information of the scale is found by the use of a periodic signal obtained from the photoelectric converting means. The optical means has a polarization maintaining optical fiber in a portion thereof and is designed such that the planes of polarization of the two diffracted lights created from the minute grating array are orthogonal to each other and the directions of the planes of polarization form 45° with respect to the f-axis or s-axis of the plane-of-polarization holding fiber.

(1-B) In an encoder wherein a light beam from light source means is applied to the minute grating array of a scale provided with a minute grating scale through optical means, two diffracted light beams of different orders created from the minute grating array are taken out through a detecting optical system and a portion of the optical means and are superposed one upon the other and caused to interfere with each other, the light and shade signal of the light beam based on the interference is detected by photoelectric converting means and the relative movement information of the scale is found by the use of a periodic signal obtained from the photoelectric converting means. The optical means has a plane-of-polarization holding fiber in a portion thereof and is designed such that the planes of polarization of the two diffracted light beams created from the minute grating array are orthogonal to each other and the directions of the planes of polarization are parallel to the f-axis or s-axis of the plane-of-polarization holding fiber.

Particularly, the two diffracted light beams created from the minute grating array are reciprocally passed through the detecting optical system and are diffracted again by the minute grating array, whereafter they are directed to the optical means.

(1-C) In an encoder wherein two light beams of different frequencies ($\nu_1$, $\nu_2$) from light source means oscillating light beams of at least two frequencies are applied to the minute grating array of a scale provided with a minute grating array through optical means, two sets of two diffracted light ($\nu_1^m$, $\nu_2^m$) and ($\nu_1^n$, $\nu_2^m$) of different orders (m, n) differing in frequency from each other and having planes of polarization orthogonal to each other are formed from diffracted lights created from the minute grating array, the two sets of two diffracted lights are superposed one upon the other and caused to interfere with each other to thereby form two independent bright and dark beams ($\nu_2^n - \nu_1^m$) and ($\nu_2^m - \nu_1^n$), the two bright and dark beams are detected by photoelectric converting means and the relative movement information of the scales is found by the use of a periodic signal obtained from the photoelectric converting means. The optical means has a polarization maintaining optical fiber in a portion thereof and is designed such that the directions of the planes of polarization of the two bright and dark beams are parallel to the f-axis or s-axis of the polarization maintaining optical fiber.

Particularly, the principle of the heterodyne interference method is applied, whereby a signal obtained from the encoder of the diffracted light interference type is produced and transmitted as a particular periodic signal (a bright and dark signal) which continues to be produced even when the scale which is an object to be measured is stopped.

In this system, two light beams of different wavelengths (frequencies) are directed to discrete optical paths and the lengths of the respective optical paths (the phases) fluctuate, whereafter the light beams are returned to the original optical path and are caused to interfere with each other. At this time, there is no fluctuation of the phase between the two optical paths, and a beat signal (a bright and dark signal) of the difference between two oscillation frequencies continues to be produced. When the scale moves and a fluctuation of the phase is applied to between the two optical paths, the frequency of the beat signal increases and downs in conformity with the direction of the fluctuation.

So, the frequency deviation $\Delta\nu$ (or the phase deviation $\Delta\phi$) is detected to thereby detect the speed of the phase variation resulting from the movement of the scale (i.e., including a sign indicative of the speed and direction of movement of the scales), and further count the phase deviation e.g. at every $2\pi$ and detect the amount of phase variation resulting from the movement of the scales (i.e., including a sign indicative of the amount and direction of movement of the scale).

By the utilization of this principle, the signal is handled as the deviation of the frequency or the phase, whereby the information is made difficult to be spoiled even if during the transmission of the signal, noise mixes with the signal or the amplitude of the signal fluctuates.

Also, a polarization maintaining optical fiber is utilized to appropriately construct the coupling system between the two-frequency oscillation laser and the encoder of the diffracted light interference type. Further, the optical system is appropriately designed such that the (initial) oscillation frequencies of two light beams when diffracted lights of different orders are caused to interfere with each other become different combinations. Thereby, the loss of light in the coupling portion when the signal regarding the movement information of the scale is transmitted is made small and efficient transmission can be accomplished.

(1-D) In an encoder wherein a light beam from light source means is applied to the minute grating array of a scale provided with a minute grating array through optical means, two diffracted light beams of different orders created from the minute grating array are taken out through a detecting optical system and a portion of the optical means and are superposed one upon the other by superposing means and caused to interfere with each other, the bright and dark signal of the light beam based on the interference is detected by photoelectric converting means and the relative movement information of the scale is found by the use of a periodic signal obtained from the photoelectric converting means. The optical means has a polarization maintaining optical fiber in a portion thereof and is designed such that the planes of polarization of the two diffracted lights created from the minute grating array are orthogonal to each other and the directions of the planes of polarization are parallel to the f-axis or s-axis of the polarization maintaining optical fiber.

(1-E) In an encoder wherein two light beams of different frequencies from light source means oscillating light beams of at least two frequencies are applied to the minute grating array of a scales provided with a minute grating array through optical means, two diffracted light beams of different frequencies and different orders created from the minute grating array are taken out through a detecting optical system and a portion of the optical means and are superposed one upon the other and caused to interfere with each other, the bright and dark signal of a light beam based on the interference is detected by photoelectric converting means and the relative movement information of the scale is found by the use of a periodic signal obtained from said photoelectric converting means. The optical means has a plane-of-polarization holding fiber in a portion thereof and is designed such that the planes of polarization of the two diffracted lights created from the minute grating array are orthogonal to each other and the directions of the planes of polarization are parallel to the f-axis or s-axis of the polarization maintaining optical fiber.

Particularly, the principle of the heterodyne interference method is applied, whereby a signal obtained from the encoder of the diffracted light interference type is produced and transmitted as a particular periodic signal (a light and shade signal) which continues to be produced even when the scale which is an object to be measured are stopped.

In this system, two light beams of different wavelengths (frequencies) are directed to discrete optical paths and the length of the respective optical paths (the phases) are fluctuated, whereafter the light beams are returned to the original optical path and are caused to interfere with each other. At this time, there is no fluctuation of the phase between the two optical paths, and a beat signal (a bright and dark signal) of the difference between two oscillation frequencies continues to be produced. When the scale moves and a fluctuation of the phase is applied to between the two optical paths, the frequency of the beat signal increases and decreases in conformity with the direction of the fluctuation.

So, the frequency deviation $\Delta v$ (or the phase deviation $\Delta \phi$) is detected to thereby detect the speed of the phase variation resulting from the movement of the scale (i.e., including a sign indicative of the speed and direction of movement of the scale), and further count the phase direction e.g. at every $2\pi$ and detect the amount of phase variation resulting from the movement of the scale (i.e., including a sign indicative of the amount and direction of movement of the scale).

By the utilization of this principle, the signal is handled as the deviation of the frequency or the phase, whereby the information is made difficult to be spoiled even if during the transmission of the signal, noise mixes with the signal or the amplitude of the signal fluctuates.

Also, a polarization maintaining optical fiber is utilized to appropriately construct the coupling system between the two-frequency oscillation laser and the encoder of the diffracted light interference type. Further, the optical system is appropriately designed such that the (initial) oscillation frequencies of two light beams when diffracted light beams of different orders are caused to interfere with each other become different combinations. Thereby, the loss of light in the coupling portion when the signal regarding the movement information of the scale is transmitted is made small and efficient transmission can be accomplished.

The embodiments of the present invention will hereinafter be specifically described with reference to the drawings.

Figure 2A:
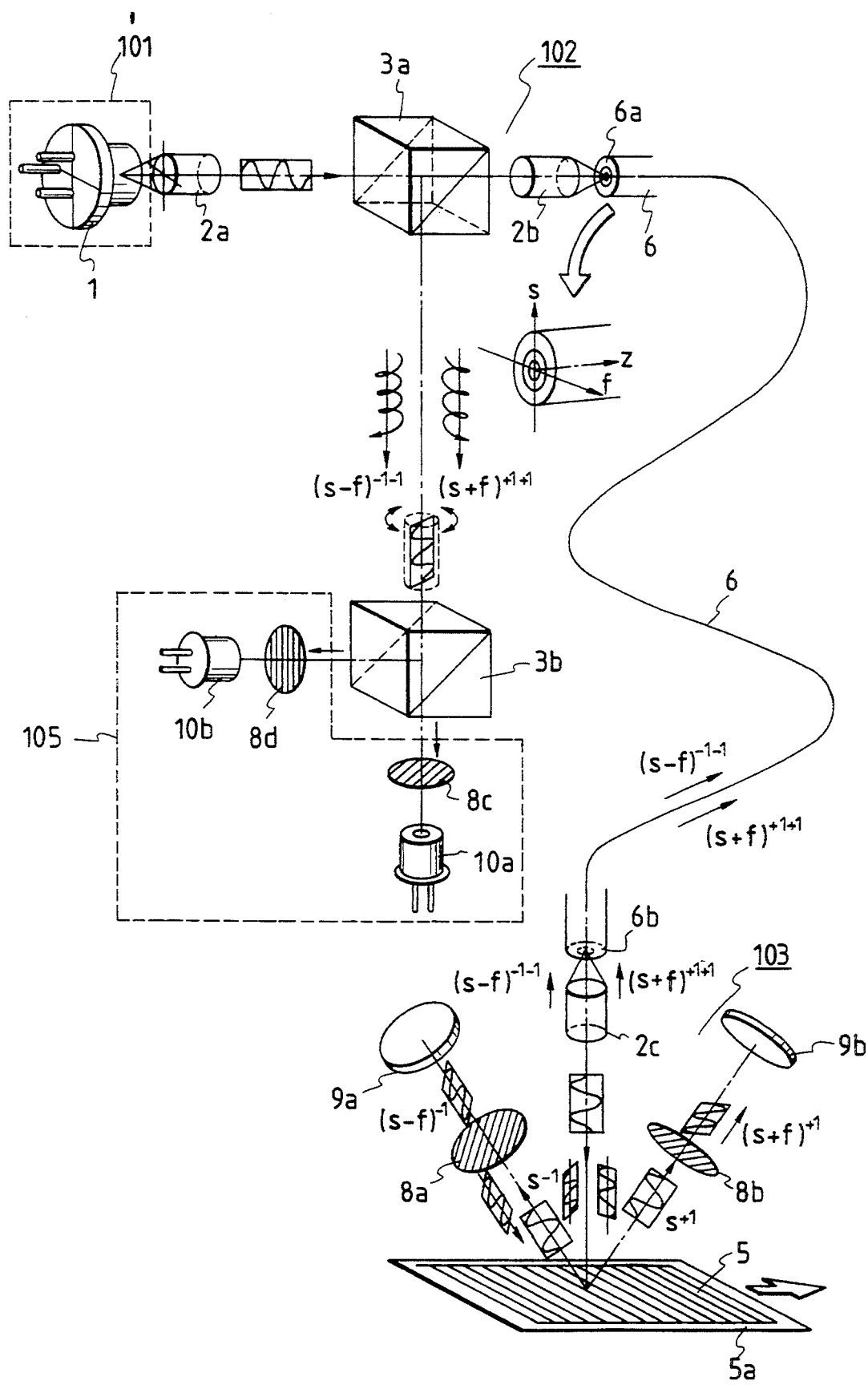
FIG. 2A is a schematic view of the essential portions of a first embodiment of the present invention.

FIG. 2A is a schematic view of the essential portions of a first embodiment of the present invention. In FIG. 2A, arrows indicate the travel azimuths of light beams, and sinusoidal symbols indicate the planes of polarization. The reference numeral 101 designates light source means having a light source 1 such as a laser or an LED emitting monochromatic light or coherent light or the like.

A diverging light beam (at this time, linearly polarized light) emitted from the light source 1 is made into a substantially parallel light beam by a collimator lens 2a, is transmitted through a non-polarizing beam splitter 3a and enters a coupling lens 2b. The light beam from the coupling lens 2b enters a first end surface (entrance surface) 6a of a polarization maintaining optical fiber 6. At this time, alignment is effected so that one of the optical axes (s-axis and f-axis) of the polarization maintaining optical fiber 6 and the plane of polarization of the incident light beam may be parallel to each other as shown in FIG. 2A.

(The polarization maintaining optical fiber 6 propagates a light beam therethrough while maintaining the polarized state. As regards the optical axes of the polarization maintaining-optical fiber 6, the direction in which the propagation speed of the light wave is higher is the f-axis and the direction in which the propagation speed of the light wave is lower is the s-axis.)

The light beam emerging from a second end surface (exit surface) 6b of the polarization maintaining optical fiber 6 is a light beam having one of the s-axis component and the f-axis component. The light beam from the exit surface 6b of the polarization maintaining optical fiber 6 is made into a substantially parallel light beam by a coupling lens 2c and enters a minute grating array 5 comprising a diffraction grating on a scale 5a.

The elements 2a, 3a, 2b, 6 and 2c constitute one element of optical means 102 for causing the light beam from the light source means 101 to enter the scale 5a.

Of a plurality of diffracted lights created from the minute grating array 5, for example, ±1st-order diffracted lights are reflected by mirrors 9a and 9b through polarizing plates 8a and 8b and are returned to the original optical path, and are again caused to enter the minute grating array 5 of the scale 5a.

At this time, by the polarizing plates 8a and 8b, as shown in FIG. 2A, the +1st-order diffracted light is made into linearly polarized light $(s+f)^{+1}$ whose plane of polarization is in an angular relation of 45° with the s-axis and the −1st-order diffracted light is made into linearly polarized light $(s-f)^{-1}$ whose plane of polarization is in an angular relation orthogonal thereto. The elements 8a, 8b, 9a and 9b constitute the elements of a detecting optical system 103.

These two light beams $(s+f)^{+1}$ and $(s-f)^{-1}$ are again diffracted by the minute grating array 5 and only the +1st-order diffracted light $(s+f)^{+1+1}$ of the +1st-order diffracted light and the −1st-order diffracted light $(s-f)^{-1-1}$ of the −1st-order diffracted light enter the coupling lens 2c.

By the coupling lens 2c, the two light beams $(s+f)^{+1+1}$ and $(s-f)^{-1-1}$ which have entered the plane-of-polarization holding fiber 6 are made to assume planes of linear polarization forming 45° with respect to the s-axis and the f-axis, respectively, and are orthogonal to each other, and propagate through the plane-of-polarization holding fiber 6.

At this time, during the propagation through the polarization maintaining optical fiber 6, the light beam $(s+f)^{+1+1}$ soon becomes right-handed elliptically polarized light and at last, becomes right-handed circularly polarized light at the exit 6a, while the light beam $(s-f)^{-1-1}$ soon becomes left-handed elliptically polarized light and at last, becomes left-handed circularly polarized light at the exit 6a. (or vice versa.)

This phenomenon occurs due to the difference in propagation speed between the optical axes (s and f) of the polarization maintaining optical fiber 6, and the interchange between linearly polarized light and circularly polarized light is effected when the length L of the fiber satisfies the following relational expression:

$$L = \lambda_0(\tfrac{1}{4}+n)/\beta \quad \text{(a)}$$

where L and $\beta$ are the length and the mode refractive index, respectively, of the polarization maintaining optical fiber, $\lambda_0$ is the wavelength of the light beam from the light source 1, and n is an integer.

So, in the present embodiment, as relational expression (a), each element is set so as to satisfy $$0.9 < (\tfrac{1}{4}+n)\cdot\lambda_0/(\beta\cdot L) < 1.1 \quad \text{(b)}$$

Thereby the desired object is achieved well.

The two light beams emerging from the first end surface 6a of the polarization maintaining optical fiber 6 are made into substantially parallel light beams by the coupling lens 2b with the directions of rotation of their planes of polarization kept opposite to each other, and are reflected by the non-polarizing beam splitter 3a.

When these two light beams are combined in a vector-like fashion, they become a linearly polarized light beam whose polarization azimuth is primarily determined by the phase difference between the light beam $(s+f)^{+1+1}$ and the light beam $(s-f)^{-1-1}$. Consequently, as long as the scale 5a is moving in one direction, the phase difference between the two light beams deviates continuously and therefore, the plane of polarization of the linearly polarized light continues to rotate. The polarization azimuth of the linearly polarized light rotates by 180° each time the phase difference between the two light beams becomes $2\pi$.

This light beam is divided into two light beams by a non-polarizing beam splitter 3b, whereafter these two light beams are transmitted through polarizing plates (analyzers) 8c and 8d whose directions of transmission and polarization deviate from each other. These light beams are converted into light beams of such light and shade signals that the quantity of transmitted light becomes greatest at a timing at which the plane of polarization of the linearly polarized light beam and the polarization azimuths of the polarizing plates 8c, 8d coincide with each other, and becomes smallest at a timing orthogonal thereto. The timing of the light and shade between the two light and shade signals can be provided by deviating the setting of the azimuths of transmission and polarization of the two polarizing plates.

The light beams of these light and shade signals are converted into electrical signals by photoelectric elements 10a and 10b as photoelectric converting means 105, and after the amplitudes thereof are amplified, a two-phase signal as the encoder is output.

In the present embodiment, movement information such as the amount and direction of movement of the scale 5a is detected by the use of the signals obtained from the photoelectric converting means 105 (photoelectric elements 10a and 10b) at this time.

As described above, in the present embodiment, a plane-of-polarization holding fiber and each element are appropriately constructed, that is, when the two diffracted light beam created from the minute grating array of the scale are transmitted through the fiber, the planes of polarization of the two diffracted lights are made orthogonal to each other so that the two light beams may not interfere with each other to provide a bright and dark signal and further, the two diffracted lights are caused to enter the polarization maintaining optical fiber so as to form 45° with respect to one of the optical axes (f-axis and s-axis) of the polarization maintaining optical fiber and the transmitted therethrough, and by the utilization of the difference in propagation speed between the s-axis and the f-axis of the polarization maintaining optical fiber, the respective linearly polarized light beams are converted into circularly polarized light beams opposite in direction to each other at the exit of the polarization maintaining optical fiber, and the vectorially combined light beam of the two light beams can be transmitted so as to become a linearly polarized light beam in which the phase difference information between the two light beams has been converted into the information of the azimuth of the plane of polarization of linearly polarized light, whereby the movement information of the scale 5a is detected highly accurately while the simplification of the entire apparatus is achieved.

In the above-described first embodiment of the present invention, the following changes of the elements are equally applicable.

(2-A) One can utilize a combination of diffracted lights of the other orders than the ±1st-order diffracted light as the diffracted light from the minute grating array on the scale.

(2-B) Mirror type beam splitting means having a similar function, in lieu of the prism-like beam splitter can be used.

Figure 2B:
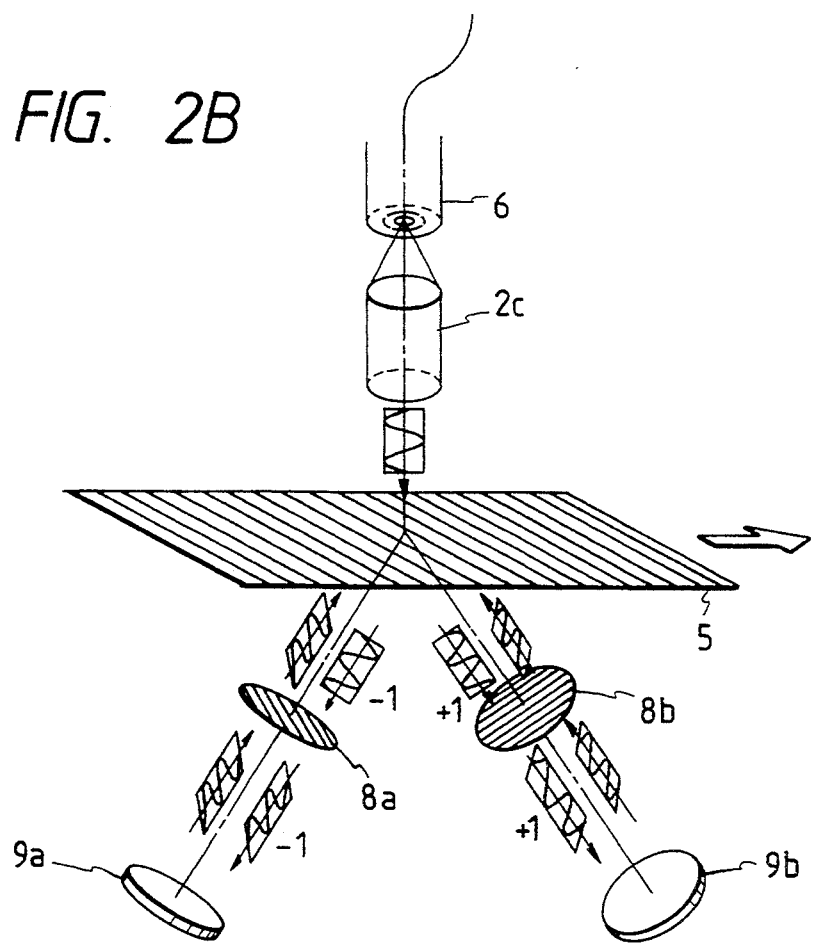
FIG. 2B is an illustration when a portion of FIG. 2A is modified.

(2-C) The two diffracted light beams obtained from the minute grating array (diffraction grating) provided on the scale are not limited to reflected type diffracted light beams, but may be transmitted type diffracted lights as shown in FIG. 2B. FIG. 2B shows only the vicinity of the scale 5a, and corresponds to FIG. 2A. In FIG. 2B, the same elements as those shown in FIG. 2A are given the same reference characters.

Figure 3:
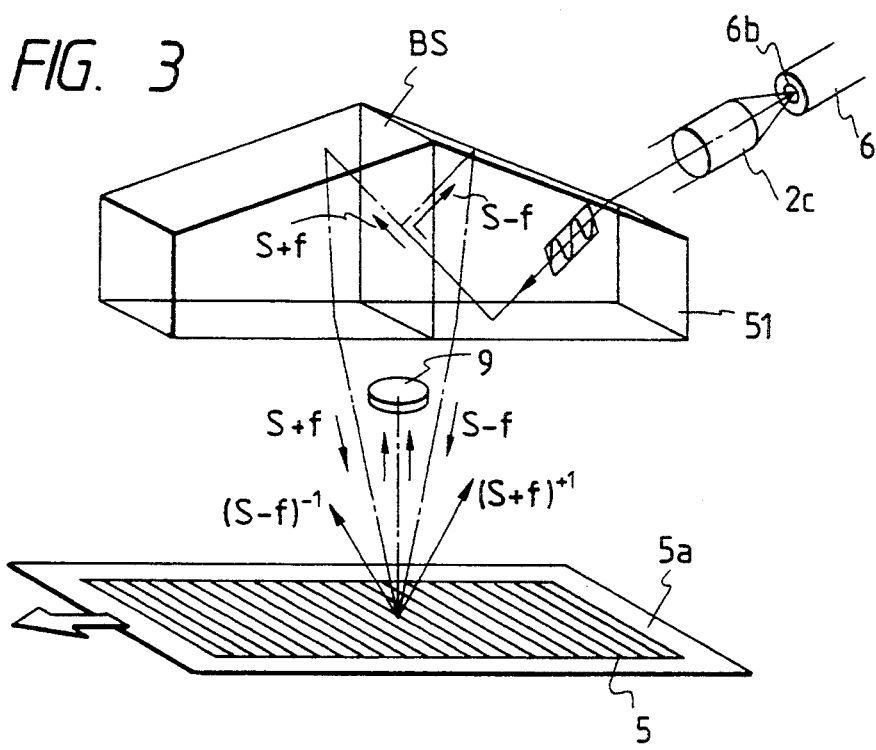
FIG. 3 is an illustration when a portion of FIG. 2A is modified.

(2-D) As shown in FIG. 3, the light beam from the polarization maintaining optical fiber 6 may first be divided into two light beams by the utilization of a prism 51 having a dividing surface BS, and then may be caused to enter the minute grating array 5 of the scale 5a.

FIG. 3 is a view developed on the basis of the optical system of the first embodiment. In FIG. 3, the light beam emerging from the exit surface 6b of the polarization maintaining optical fiber 6 is only the component of one of the azimuths of the optical axes (s-axis and f-axis) of the polarization maintaining optical fiber 6.

So, utilization is made of the dividing surface BS of a prism 51 as shown on which polarizing beam splitter film is deposited by evaporation to take out, for example, the reflected light beam from the dividing surface BS as the light beam of the plane of polarization forming 45° with respect to the f-axis and the light beam transmitted through the dividing surface as a light beam orthogonal thereto. These light beams are then subjected to +1st-order diffraction or −1st-order diffraction, whereafter they are returned to the original optical path to thereby obtain two light beams of similar properties.

Where ordinary non-polarizing beam splitter film is used in lieu of the polarizing film, polarizing plates orthogonal to each other can be disposed in the optical path applied from the prism of FIG. 3 to the scale so that the component of a plane of polarization forming 45° with respect to the s-axis and the component of a plane of polarization forming 45° with respect to the f-axis can be selected. Instead of a common mirror 9 being disposed at the positions of the diffracted lights $(s+f)^{+1}$ and $(s-f)^{-1}$, respective mirrors may be disposed at the positions of the diffracted lights $(s+f)^{+1}$ and $(s-f)^{-1}$.

(2-E) Cat's-eye optical elements, diffraction grating reflecting elements, corner cubes or the like may be used in lieu of the mirrors 9a and 9b.

If this is done, any deviation of the optical path caused by the fluctuation of the wavelength of the light beam from the light source can be corrected. Where the diffraction grating reflecting elements, if they are reflection type diffraction gratings, are periodic gratings of half of the pitch of the minute grating array 5 of the scale, the original optical path can be restored.

(2-F) As regards the structure of the cross-section of the polarization maintaining optical fiber, the elliptical core type, the PANDA type, etc. are applicable besides the so-called elliptical clad type shown.

(2-G) The minute grating array provided on the scale is not restricted to a straight one, but if use is made, for example, of a grating array comprising radial gratings recorded on a rotary disk, it can be intactly applied to a rotary encoder.

Figure 4:
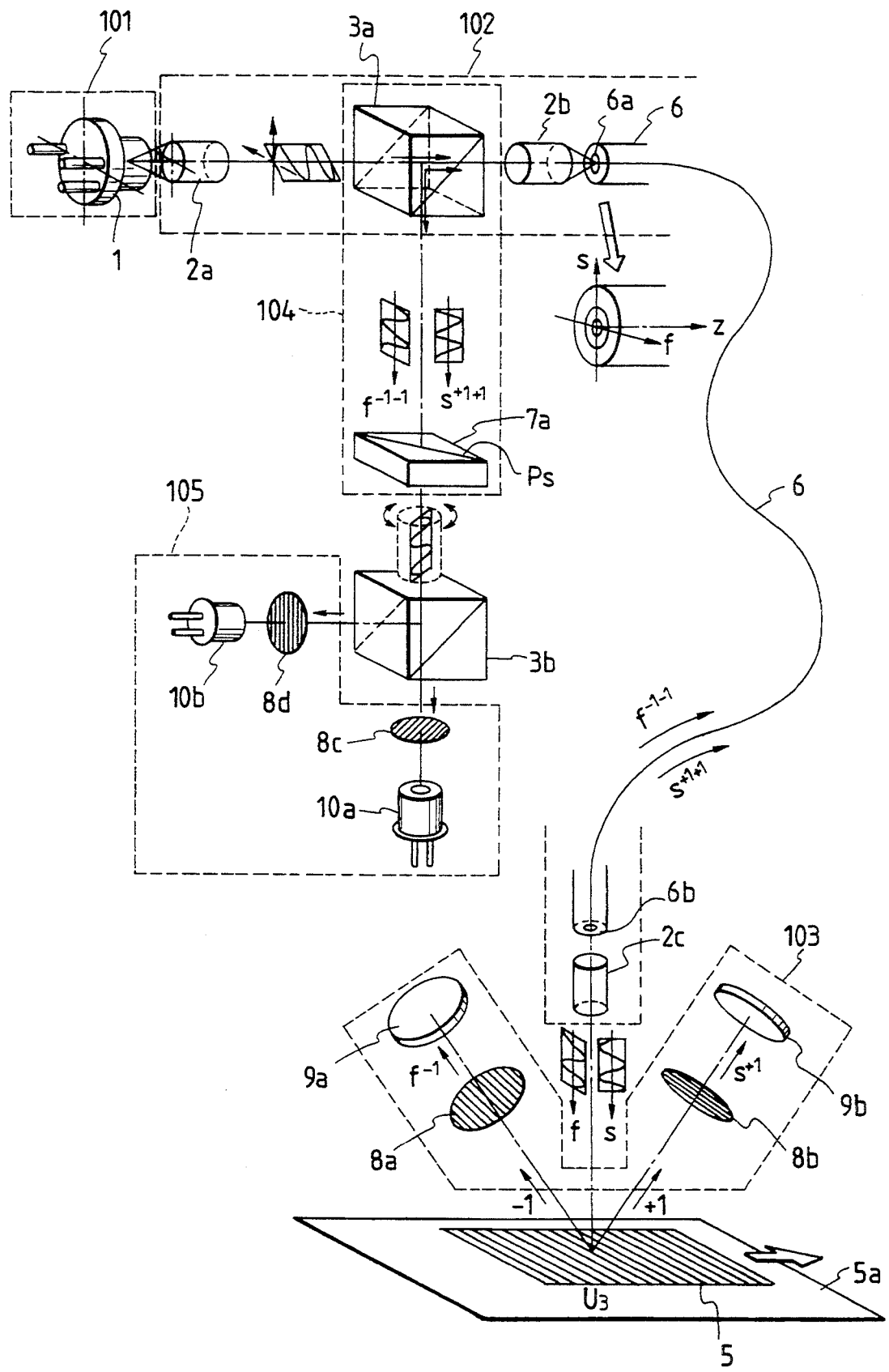
FIG. 4 is a schematic view of the essential portions of a second embodiment of the present invention.

FIG. 4 is a schematic view of the essential portions of a second embodiment of the present invention. In FIG. 4, arrows indicate the travel azimuth of the light beam, and sinusoidal symbols indicate the planes of polarization. The reference numeral 101 denotes light source means having a light source 1 such as a laser or an LED emitting monochromatic light or coherent light.

A divergent light beam (in this case, linearly polarized light) emitted from the light source 1 is made into a substantially parallel light beam by a collimator lens 2a, is transmitted through a non-polarizing beam splitter 3a and enters a coupling lens 2b. The light beam from the coupling lens 2b enters a first end surface (entrance surface) 6a of a polarization maintaining optical fiber 6. At this time, alignment is effected so that the angle formed between the optical axes (s-axis and f-axis) of the polarization maintaining optical fiber 6 and the plane of polarization of the incident light beam may be about 45° as shown in FIG. 4.

The light beam emerging from a second end surface (exit surface) 6b of the polarization maintaining optical fiber 6 is a light beam having an s-axis component and an f-axis component. The light beam from the exit surface 6b of the polarization maintaining optical fiber 6 is made into a substantially parallel light beam by a coupling lens 2c, and this light beam enters a minute grating array 5 comprising a diffraction grating on a scale 5a.

The elements 2a, 3a, 2b, 6 and 2c each constitute one element of optical means 102 for causing the light beam from the light source means 101 to enter the scale 5a.

Of a plurality of diffracted lights created from the minute grating array 5, for example ±1st-order diffracted light beams are reflected by mirrors 9a and 9b through polarizing plates 8a and 8b, are returned to the original optical path and are again caused to enter the minute grating array 5 of the scale 5a.

At this time, by the polarizing plates 8a and 8b, as shown in FIG. 4, the +1st-order diffracted light is made into only linearly polarized light $(s^{+1})$ parallel to the s-axis and the −1st-order diffracted light is made into only linearly polarized light $(f^{-1})$ parallel to the f-axis. The elements 8a, 8b, 9a and 9b constitute the elements of a detecting optical system 103.

These two light beams $(s^{+1}$ and $f^{-1})$ are again diffracted by the minute grating array 5, and only the +1st-order diffracted light $(s^{+1+1})$ of the +1st-order diffracted light and the −1st-order diffracted light $(f^{-1-1})$ of the −1st-order diffracted light enter the coupling lens 2c. The two light beams $(s^{+1+1})$ and $(f^{-1-1})$ caused to enter the plane-of-polarization holding fiber 6 again by the coupling lens 2c assume planes of polarization parallel to the s-axis and the f-axis, respectively, and propagate through the polarization maintaining optical fiber 6 independently (without mutual interference).

The two light beams emerging from the first end surface 6a of the polarization maintaining optical fiber 6 are made into substantially parallel light beams by the coupling lens 2b with their planes of polarization kept orthogonal to each other, are reflected by the non-polarizing beam splitter 3a and are transmitted through a quarter wavelength plate 7a. At this time, by the quarter wavelength plate 7a being mounted so that the crystal axes thereof (there are the s-axis and the f-axis in the quarter wavelength plate as in the polarization maintaining optical fiber, but these axes are shown as Pf-axis and Ps-axis in FIG. 4 so that they may be readily understood) may be at the azimuth of 45° with respect to the planes of polarization of the two light beams, the light beam $(s^{+1+1})$ is made into a right-handed circularly polarized light beam and the light beam $(f^{-1-1})$ is made into a left-handed circularly polarized light beam. (or vice versa.)

The elements 3a and 7a each constitute one element of superposing means 104.

When these two light beams are combined together in a vector-like fashion, they become a linearly polarized light beam having its polarization asimuth primarily determined by the phase difference between the light beam $(s^{+1+1})$ and the light beam $(f^{-1-1})$. Consequently, as long as the scale 5a is moving in one direction, the phase difference between the two light beams deviates continuously and therefore, the plane of polarization of the linearly polarized light continues to rotate. The polarization azimuth of the linearly polarized light rotates by 180° each time the phase difference between the two light beams becomes $2\pi$.

This light beam is divided into two light beams by a non-polarizing beam splitter 3b, whereafter the two light beams are transmitted through polarizing plates (analyzers) 8c and 8d, respectively, whose directions of transmission and polarization deviate from each other. At this time, the two light beams are converted into light beams of bright and dark signals in which the quantity of transmitted light becomes greatest at a timing at which the plane of polarization of the linearly polarized light beam and the polarization azimuths of the polarizing plates 8c, 8d coincide with each other, and becomes smallest at a timing orthogonal thereto. The timing of bright and dark between the two light and shade signals can be provided by deviating the setting of the azimuths of transmission and polarization of the two polarizing plates.

The light beams of these bright and dark signals are converted into electrical signals by photoelectric elements 10a and 10b as photoelectric means 105, and after the amplitudes thereof are amplified, a two-phase signal as the encoder is output.

In the present embodiment, movement information such as the amount and direction of movement of the scale 5a is detected by the use of the signals obtained from the photoelectric converting means 105 (photoelectric elements 10a, 10b) at this time.

As described above, in the present embodiment, a polarization maintaining optical fiber and each element are appropriately constructed, that is, when two diffracted lights created from the minute grating array of the scale are to be transmitted through the polarization maintaining optical fiber, the two light beams are caused to enter together and transmitted through the polarization maintaining optical fiber with the planes of polarization of the two diffracted lights made orthogonal to each other so that the two light beams may not interfere with each other to provide a bright and dark signal and further may be parallel to one of the optical axes (f-axis and s-axis) of the polarization maintaining optical fiber, whereby the movement information of the scale 5a is detected highly accurately while the simplification of the entire apparatus is achieved.

Figure 5:
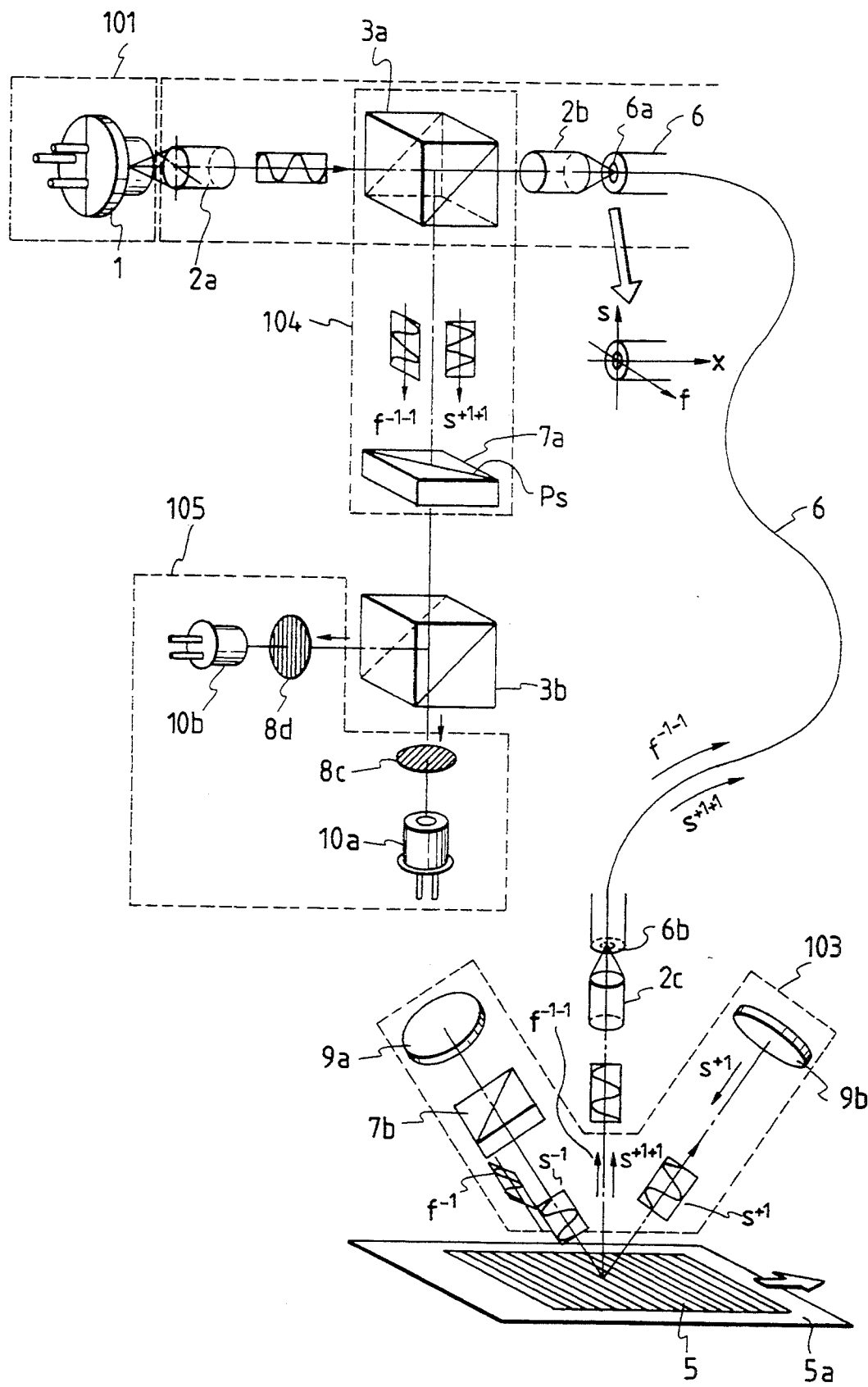
FIG. 5 is a schematic view of the essential portions of a third embodiment of the present invention.

FIG. 5 is a schematic view of the essential portions of a third embodiment of the present invention.

In the present embodiment, a light beam from light source means 101 enters a polarization maintaining optical fiber 6 with the plane of polarization thereof parallel to the optical axes of the polarization maintaining optical fiber 6 and propagates through the polarization maintaining optical fiber 6, whereafter the light beam enters the minute grating array 5 of a scale 5a. The present embodiment is the same as the second embodiment of FIG. 4 with the exception that the two diffracted lights from the minute grating array 5 enter the polarization maintaining optical fiber 6 with the plane of polarization of one of the two diffracted light beams rotated by 90° by a crystal optical element (a quarter wavelength plate) 7b.

That is, the divergent light beam (in this case, linearly polarized light) emitted from the light source 1 is made into a substantially parallel light beam by a collimator lens 2a, is transmitted through a non-polarizing beam splitter 3a and enters a coupling lens 2b. The light beam from the coupling lens 2b enters a first end surface (entrance surface) 6a of the polarization maintaining optical fiber 6. At this time, alignment is effected so that one of the optical axes (s-shaft and f-shaft) of the plane-of-polarization holding fiber 6 and the plane of polarization of the incident light beam may coincide with each other as shown.

Here, let it be assumed that the plane of polarization of the incident light beam is made coincident with the s-axis. The light beam emerging from a second end surface (exit surface) 6b of the polarization maintaining optical fiber 6 is a light beam having an s-axis component. The light beam from the exit surface 6b of the polarization maintaining optical fiber 6 is made into a substantially parallel light beam by a coupling lens 2c, and enters the minute grating array 5 comprising diffraction gratings on the scale 5a.

Of a plurality of diffracted light created from the minute grating array 5, for example, of the +1st-order diffracted light ($s^{+1}$) and the −1st-order diffracted light ($s^{31\ 1}$), one diffracted light ($s^{-1}$) is reflected by mirrors 9a and 9b through the crystal optical element. (quarter wavelength plate) 7b and is returned to the original optical path, and is again caused to enter the minute grating array 5 of the scale 5a.

The quarter wavelength plate 7b is disposed so that the crystal axis (Ps axis) thereof may form 45° with respect to the plane of polarization of the light beam ($s^{-1}$). As a result, the light beam ($s^{-1}$) is converted into a light beam ($f^{-1}$) whose plane of polarization is orthogonal to that of the light beam ($s^{-1}$), and is again caused to enter the minute grating array 5.

These two light beams ($s^{+1}$) and ($f^{-1}$) are again diffracted by the minute grating array 5 and only the +1st-order diffracted light ($s^{+1+1}$) of the +1st-order diffracted light and the −1st-order diffracted light ($f^{-1-1}$) of the −1st-order diffracted light enter the coupling lens 2c. The two light beams ($s^{+1+1}$) and ($f^{-1-1}$) again caused to enter the polarization maintaining optical fiber 6 by the coupling lens 2c assume planes of polarization parallel to the s-axis and the f-axis, respectively, and propagate through the polarization maintaining optical fiber 6 independently (without mutual interference).

The two light beams emerging from the first end surface 6a of the plane-of-polarization holding fiber 6 are made into substantially parallel light beams by the coupling lens 2b with their planes of polarization kept orthogonal to each other, are reflected by the non-polarizing beam splitter 3a and are transmitted through the quarter wavelength plate 7a. At this time, by the quarter wavelength plate 7a being mounted so that the crystal axis thereof (there are the s-axis and the f-axis in the quarter wavelength plate as in the polarization maintaining optical fiber, but these axes are shown as Pf axis and Ps axis in FIG. 5 so that they may be readily understood) may be at the azimuth of 45° with respect to the planes of polarization of the two light beams, the light beam ($s^{+1+1}$) is made into a right-handed circularly polarized light beam and the light beam ($f^{-1-1}$) is made into a left-handed circularly polarized light beam. (Or vice versa.)

When these two light beams are combined together in a vector-like fashion, they become a linearly polarized light beam having its polarization azimuth primarily determined by the phase difference between the light beam ($s^{+1+1}$) and the light beam ($f^{-1-1}$). Consequently, as long as the scale 5a is moving in one direction, the phase difference between the two light beams deviates continuously and therefore, the plane of polarization of the linearly polarized light continues to rotate. The polarization azimuth of the linearly polarized light rotates by 180° each time the phase difference between the two light beams becomes $2\pi$.

This light beam is divided into two light beams by a non-polarizing beam splitter 3b, whereafter the two light beams are transmitted through polarizing plates (analyzers) 8c and 8d, respectively, whose directions of transmission and polarization are deviated from each other. At this time, the two light beams are converted into light beams of bright and dark signals in which the quantity of transmitted light becomes greatest at a timing at which the plane of polarization of the linearly polarized light beam and the polarization azimuths of the polarizing plates 8a, 8b coincide with each other, and becomes smallest at a timing orthogonal thereto. The timing of light and shade between the two bright and dark signals can be provided by deviating the setting of the azimuths of transmission and polarization of the two polarizing plates.

The light beams of these bright and dark signals are converted into electrical signals by photoelectric elements 10a and 10b as photoelectric converting means 105, and after the amplitudes thereof are amplified, a two phase signals as the encorder signals are output.

In the present embodiment, as in the second embodiment, movement information such as the amount and direction of movement of the scale 5a is detected by the use of the signals obtained from the photoelectric converting means 105 (photoelectric elements 10a, 10b) at this time.

In the above-described second and third embodiments of the present invention, the following changes of the elements are equally applicable.

(3-A) One can utilize a combination of diffracted light of the other orders than the ±1st-order diffracted light as the diffracted light from the minute grating array on the scale.

(3-B) A mirror type beam splitting means having a similar function in lieu of the prism-like beam splitter can be used.

Figure 6:
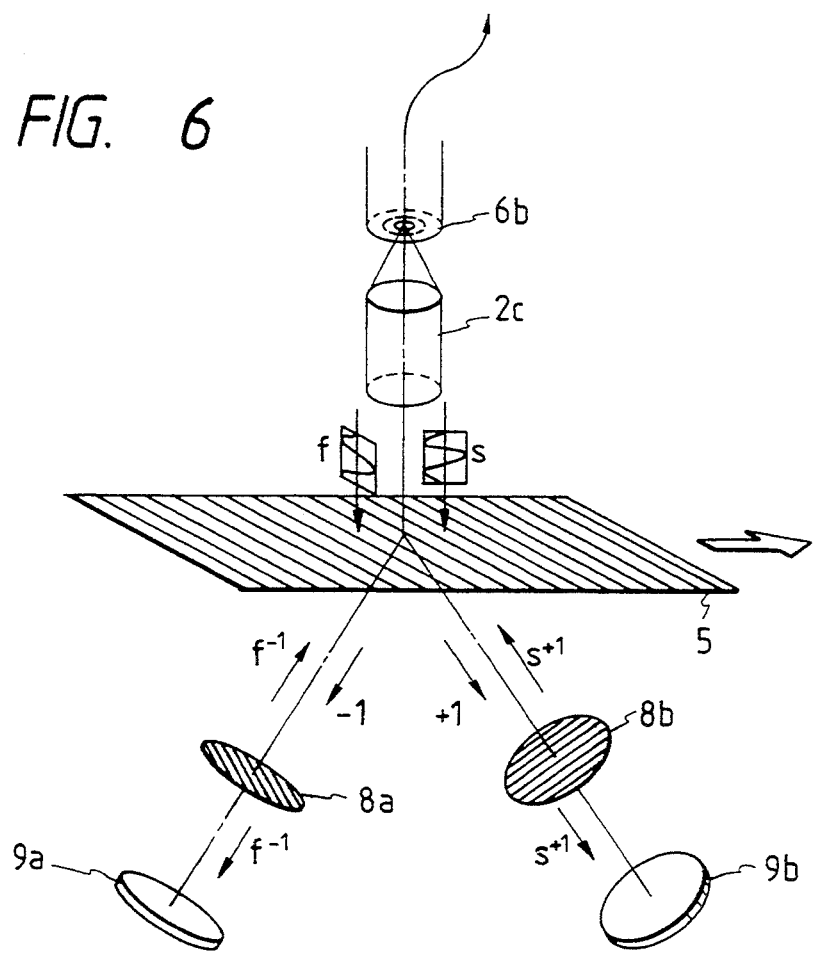
FIG. 6 is an illustration when a portion of FIG. 4 is modified.
Figure 7:
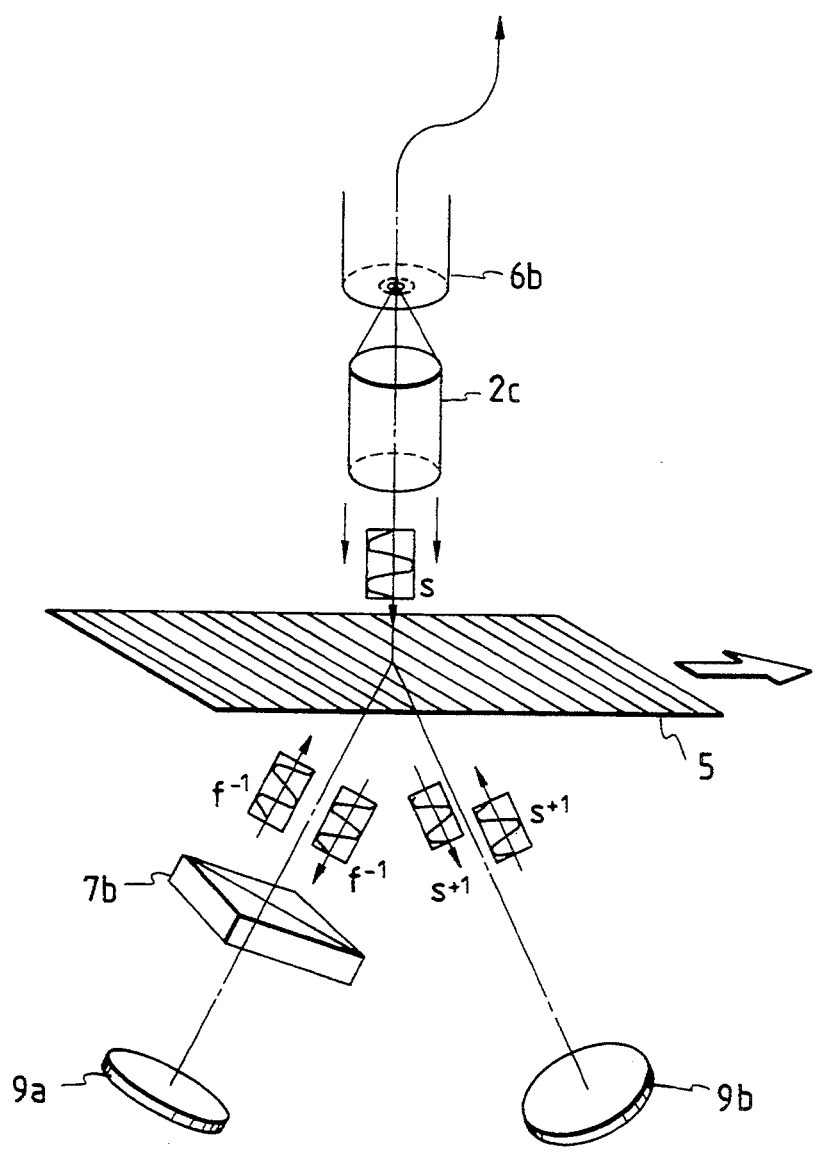
FIG. 7 is an illustration when a portion of FIG. 5 is modified.

(3-C) The two diffracted lights obtained from the minute grating array (diffraction grating) provided on the scale are not limited to reflected type diffracted lights, but may be transmitted type diffracted lights as shown in FIGS. 6 and 7. FIGS. 6 and 7 show only the vicinity of the scale 5a, and correspond to FIGS. 4 and 5, respectively. In FIGS. 6 and 7, the same elements as those shown in FIGS. 4 and 5 are given the same reference characters.

Figure 8:
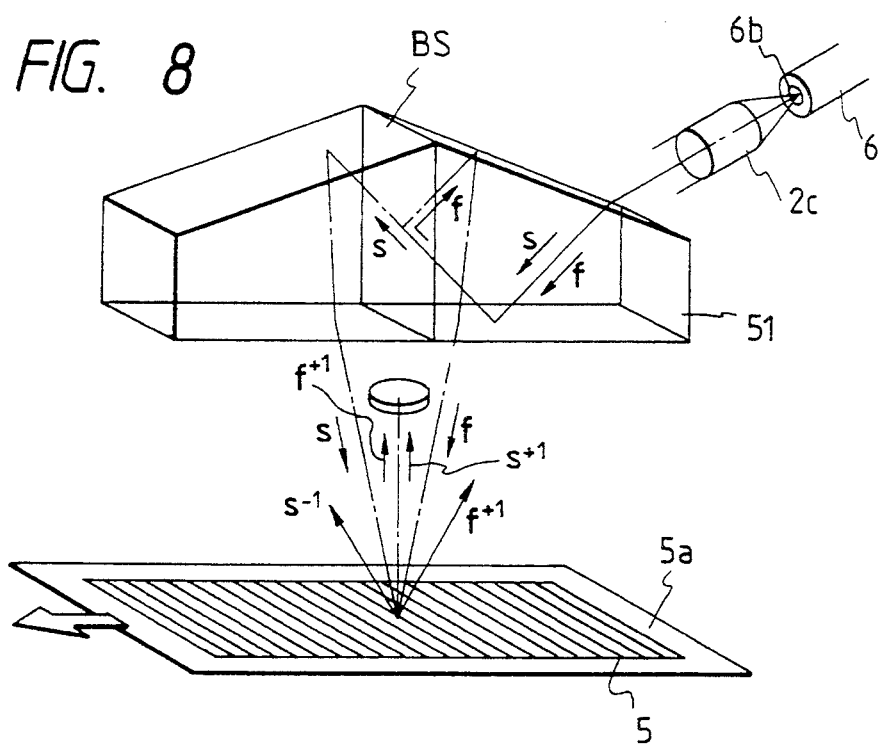
FIG. 8 is an illustration when a portion of FIG. 4 is modified.

(3-D) As shown in FIG. 8, the light beam from the polarization maintaining optical fiber 6 may first be divided into two light beams by the utilization of a prism 51 having a dividing surface BS, and then the two light beams may be caused to enter the minute grating array 5 of the scale 5a.

FIG. 8 is a view developed on the basis of the optical system of the second embodiment. In FIG. 8, the light beam emerging from the exit surface 6b of the polarization maintaining optical fiber 6 includes the components of the azimuths of the optical axes (s-axis and f-axis) of the plane-of-polarization holding fiber 6 in equal amounts.

So, utilization is made of the dividing surface BS of the prism 51 as shown on which polarizing beam splitter film is deposited by evaporation, whereby for example, the reflected light beam on the dividing surface BS and the light beam transmitted through the driving surface BS are separately taken out as an f-axis component light beam and an s-axis component light beam, respectively. These light beams are subjected to +1st-order diffraction or −1st-order diffraction, and are returned to the original optical path to thereby obtain two light beams of similar properties.

Where ordinary non-polarizing beam splitter film are used in lieu of polarizing film, polarizing plates can be disposed in the optical path applied from the prism to the scale so that they may be orthogonal to each other and the s-axis component and the f-axis component can be selected respectively. Instead of a common mirror 9 being disposed at the positions of the diffracted lights $s^{-1}$ and $f^{+1}$, respective mirrors may be disposed at the positions of the diffracted lights $s^{+1}$ and $f^{-1}$.

Figure 9:
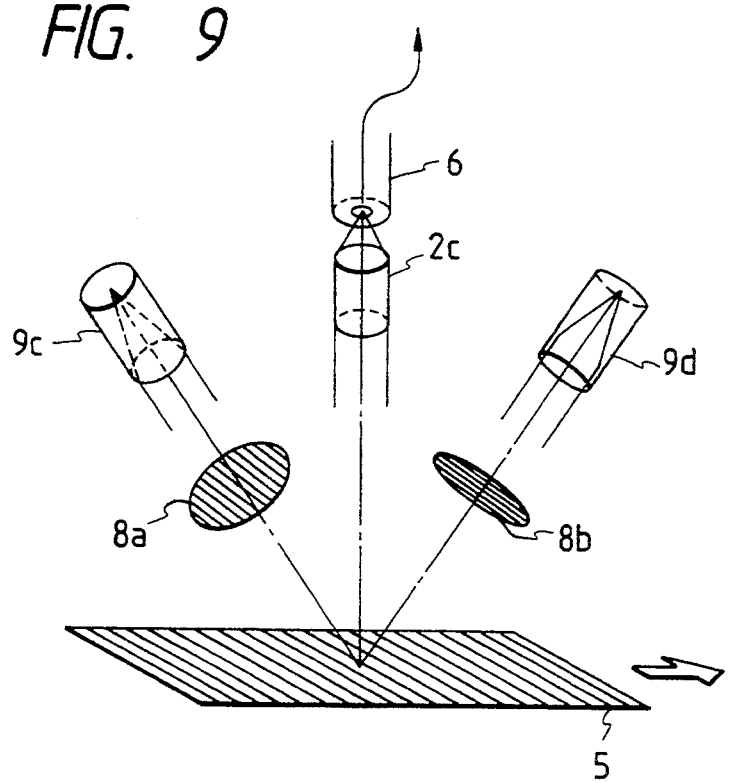
FIG. 9 is an illustration when a portion of FIG. 4 is modified.
Figure 10:
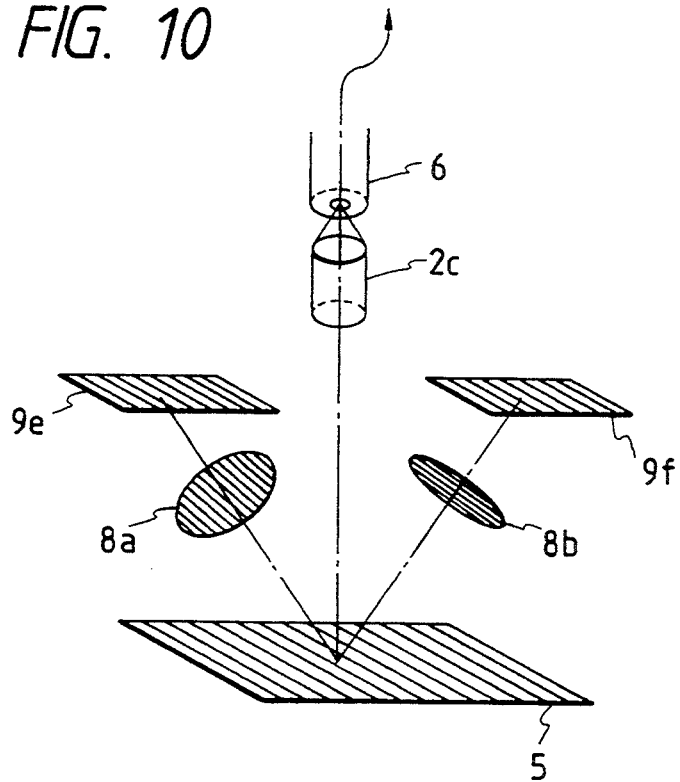
FIG. 10 is an illustration when a portion of FIG. 4 is modified.

(3-E) Cat's-eye optical elements 9c, 9d shown in FIG. 9, or diffraction grating reflecting elements 9e, ff shown in FIG. 10, corner cubes or the like may be used in lieu of the mirrors 9a, 9b.

If this is done, any deviation of the optical path caused by the fluctuation of the wavelength of the light beam from the light source can be corrected. Where the diffraction grating reflecting elements 9e and 9f, if they are reflection type diffraction gratings, are periodic gratings of half of the pitch of the minute grating array 5 of the scale, the original optical path can be restored.

(3-F) As regards the structure of the cross-section of the polarization maintaining optical fiber, the elliptical core type, the PANDA type, etc. are applicable besides the so-called elliptical clad type shown.

(3-G) The minute grating array provided on the scale is not restricted to a straight one but if use is made, for example of a grating array comprising radial gratings recorded on a rotary disk, it can be intactly applied to a rotary encoder.

Figure 11:
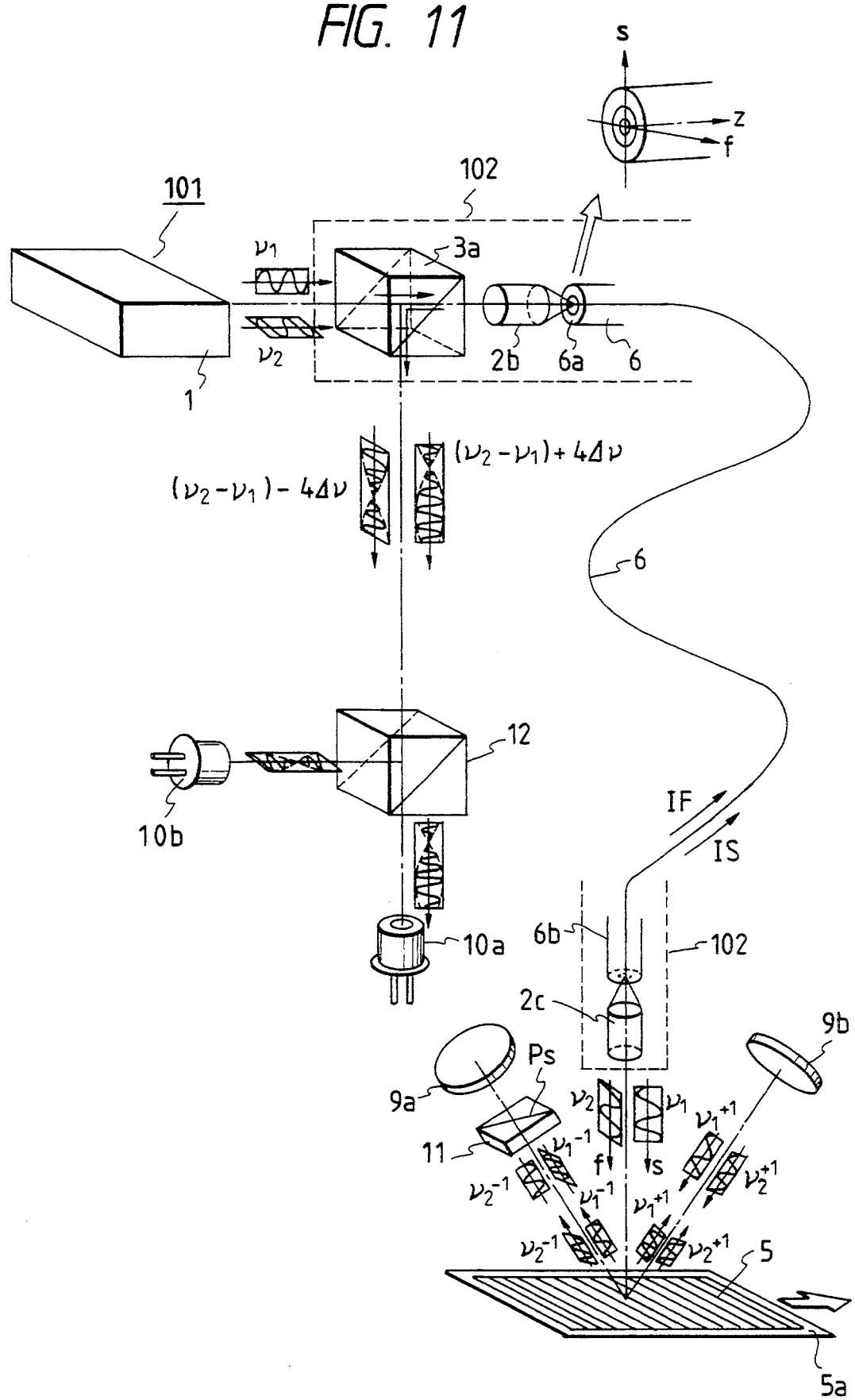
FIG. 11 is a schematic view of the essential portions of a fourth embodiment of the present invention.

FIG. 11 is a schematic view of the essential portions of a fourth embodiment of the present invention. In FIG. 11, arrows indicate the travel azimuths of the light beams, and sinusoidal symbols indicate the planes of polarization. The reference numeral 101 designates light source means having a light source 1 such as a two-frequency oscillation laser oscillating light beams of at least two frequencies. ($\nu_1$ and $\nu_2$) (wavelengths).

Two light beams ($\nu_1$ and $\nu_2$) of different frequencies which are substantially parallel and whose planes of polarization are orthogonal to each other are emitted from the light source 1 while being superposed one upon the other. These two light beams ($\nu_1$ and $\nu_2$) are transmitted through a non-polarizing beam splitter 3a, are condensed by a coupling lens 2b and enter a first end surface (entrance surface) 6a of a polarization maintaining optical fiber 6. At this time, alignment is effected so that the optical axes (s-axis and f-axis) of the plane-of-polarization holding fiber 6 and the planes of polarization of the two light beams ($\nu_1$ and $\nu_2$) may coincide with one another. (Either combination will do.)

(The polarization maintaining optical fiber 6 propagates the light beams therethrough while maintaining the polarizing state. As regards the optical axes of the polarization maintaining optical fiber 6, the direction in which the propagation speed of the light wave is higher is the f-axis and the direction in which the propagation speed of the light wave is lower is the s-axis.)

The design is made such that the s-axis component light beam and the f-axis component light beam of the light beam emerging from a second end surface (exit surface) 6b of the polarization maintaining optical fiber 6 correspond to the light beam $\nu_1$ and the light beam $\nu_2$, respectively.

The two light beams ($\nu_1$ and $\nu_2$) from the exit surface 6b of the polarization maintaining optical fiber 6 are made into substantially parallel light beams by a coupling lens 2c, and enter a minute grating array 5 comprising diffraction gratings on a scale 5a.

The elements 3a, 2b, 6 and 2c each constitute one element of optical means 102 for causing the light beams from the light source means 101 to enter the scale 5a.

Of a plurality of diffracted lights created from the minute grating array 5, for example, ±1st-order diffracted light beams are reflected by mirrors 9a and 9b, are returned to the optical path and are again caused to enter the minute grating array 5 of the scale 5a.

At this time, a quarter wavelength plate 11 is disposed in one optical path, i.e., in FIG. 11, the optical path of the −1st-order diffracted light. Thus, the −1st-order diffracted light before passing through this quarter wavelength plate 11 has been linearly polarized light ($s^{-1}$)
parallel to the s-axis=($\nu_1{}^{-1}$)
linearly polarized light ($f^{-1}$)
parallel to the f-axis=($\nu_2{}^{-1}$), but when it reciprocally passes through the quarter wavelength plate, it is converted into linearly polarized light ($s^{-1}$)
parallel to the s-axis=($\nu_2{}^{-1}$)
linearly polarized light ($f^{-1}$)
parallel to the f-axis=($\nu_1{}^{-1}$)

On the other hand, the +1st-order diffracted light is
linearly polarized light ($s^{+1}$)
parallel to the s-axis=($\nu_1{}^{+1}$)
linearly polarized light ($f^{+1}$)
parallel to the f-axis=($\nu_2{}^{+1}$).

These four light beams are again diffracted by the minute grating array 5a. Of these, only the +1st-order diffracted lights ($s^{+1+1}$) and ($f^{+1+1}$) of the +1st-order diffracted light and the −1st-order diffracted lights ($s^{-1-1}$) and ($f^{-1-1}$) of the −1st-order diffracted light enter the coupling lens 2c. That is, they are the following four light beams:

linearly polarized light $(s^{+1+1})$
parallel to the s-axis $=(\nu_1^{+1+1})$
linearly polarized light $(f^{+1+1})$
parallel to the f-axis $=(\nu_2^{+1+1})$
linearly polarized light $(s^{-1-1})$
parallel to the s-axis $=(\nu_2^{-1-1})$
linearly polarized light $(f^{-1-1})$
parallel to the f-axis $=(\nu_1^{-1-1})$.

At this time, two light beams having the same plane of polarization further interfere with each other and are converted into two kinds of light and shade signal light beams, which are:

the light and shade signal light beam IS of the linearly polarized light parallel to the s-axis $=(\nu_2^{-1-1})-(\nu_1^{+1+1})$ the light and shade signal light beam IF of the linearly polarized light parallel to the f-axis $=(\nu_2^{+1+1})-(\nu_1^{-1-1})$, where $\nu_2 > \nu_1$. Here, when the frequency deviations by the ±1st-order diffracted lights are described as $\pm\Delta\nu$, the following expression can be obtained:

$$(\nu_2^{-1-1})-(\nu_1^{+1+1})=(\nu_2-\nu_1)-4\Delta\nu$$

$$(\nu_2^{+1+1})-(\nu_1^{-1-1})=(\nu_2-\nu_1)+4\Delta\nu$$

(The frequency deviations of the two light and shade signal light beams are opposite to each other in direction and equal in amount.)

The two bright and dark signal light beams IS and IF again caused to enter the second end surface $6b$ of the polarization maintaining optical fiber 6 by the coupling lens $2c$ assume planes of polarization parallel to the s-axis and the f-axis, respectively. These light beams are caused to enter the plane-of-polarization holding fiber 6 while being made coincident with the optical axes thereof and propagate through the polarization maintaining optical fiber 6 independently (without mutual interference).

The two bright and dark signal light beams IS and IF emerging from the first end surface $6a$ of the polarization maintaining optical fiber 6 are made into substantially parallel light beams with their planes of polarization kept orthogonal to each other, are reflected by the non-polarizing beam splitter $3a$, and are separated in each polarized component by a polarizing beam splitter 12. Thus, they are returned to two bright and dark signal light beams repeating the bright and dark regions at substantially the difference frequency between the two oscillation frequencies and are converted into electrical signals by photoelectric elements $10a$ and $10b$ as photoelectric converting means 105, and after the amplitudes thereof are amplified, a modulated two-phase signal as an encoder utilizing heterodyne interference is obtained.

In the present embodiment, movement information such as the amount and direction of movement of the scale $5a$ is detected by the use of the signals obtained from the photoelectric converting means 105 (photoelectric elements $10a$, $10b$) at this time. That is, the absolute value of the phase difference $8\Delta\nu$ between the two signals is indicative of the amount of movement, and the positive or negative sign is indicative of the direction of movement. For example, the two signals can be input to a phase difference meter to thereby obtain such information.

As described above, in the present embodiment, a two-frequency oscillation laser, a polarization maintaining optical fiber and each element are appropriately constructed, that is, before the diffracted light of two orders created from the minute grating array of the scale are returned to the polarization maintaining optical fiber, the crystal optical element 11 for changing the plane of polarization is inserted into at least one of the optical paths of different diffraction orders (m and n) and the mth-order diffracted light and the nth-order diffracted light are converted into interference signals in such a manner that the planes of polarization thereof become uniform correspondingly to light beams of different oscillation frequencies ($\nu_1$ and $\nu_2$) and further, the diffracted light beams are caused to enter the polarization maintaining optical fiber so as to become parallel to one of the optical axes (s-axis and f-axis) of the polarization maintaining optical fiber and are transmitted through the polarization maintaining optical fiber, whereby the movement information of the scale $5a$ is detected highly accurately while the simplification of the entire apparatus is achieved.

Figure 12:
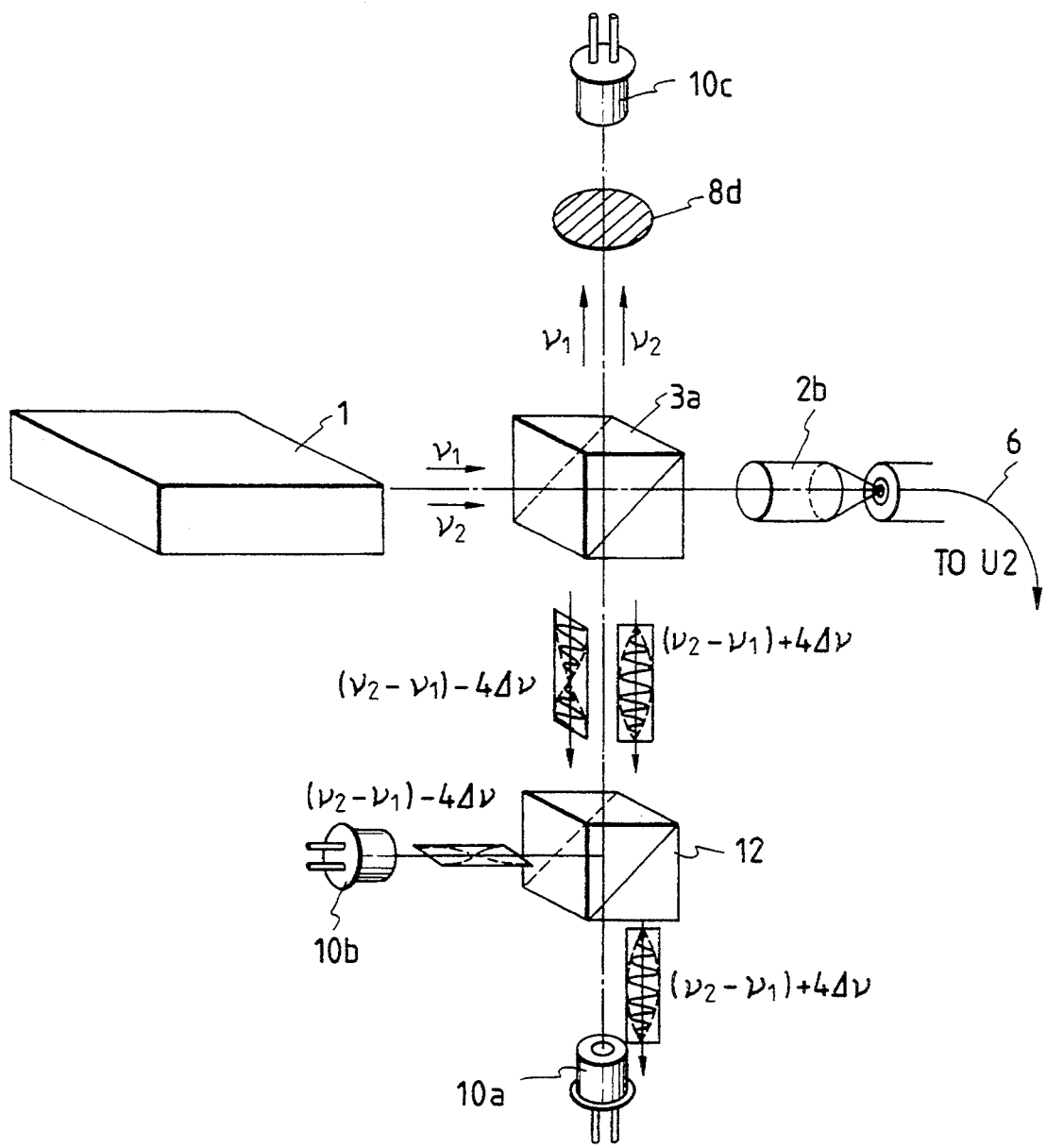
FIG. 12 is an illustration when a portion of FIG. 11 is modified.

In the present embodiment, as shown in FIG. 12, the reflected light beam from the non-polarizing beam splitter $3a$ may be utilized as the reference light and shade signal (the signal not subjected to the phase modulation by the movement of the scale $5a$=the difference signal between the oscillation frequencies of the two-frequency laser). The reference signal here is used to monitor, for example, a beat signal produced by two-wavelength light from the light source.

In such an apparatus, as shown in FIG. 12, the two light beams ($\nu_1$ and $\nu_2$) are transmitted through a polarizing plate (analyzer) $8d$ set so as to have a transmission characteristic in the azimuth of 45° with respect to the polarization azimuths of the two light beams ($\nu_1$ and $\nu_2$), and an interference phenomenon is caused to occur between the common polarized components of the two light beams.

The two light beams ($\nu_1$ and $\nu_2$) are converted into a light and shade signal light beam repeating the bright and dark arears at the difference frequency between the ocsillation frequencies of the two light beams ($\nu_1$ and $\nu_2$). This bright and dark signal light beam may be converted into an electrical signal by a photoelectric element $10c$, and after the amplitude thereof is amplified, a reference signal may be output for use.

In the above-described fourth embodiment of the present invention, the following changes of the elements are equally applicable.

(4-A) One can utilize a combination of diffracted lights of the other orders than the ±1st-order diffracted light as the diffracted light from the minute grating array on the scale.

(4-B) A mirror type beam splitting means having a similar function in lieu of the prism-like beam splitter can be used.

Figure 13:
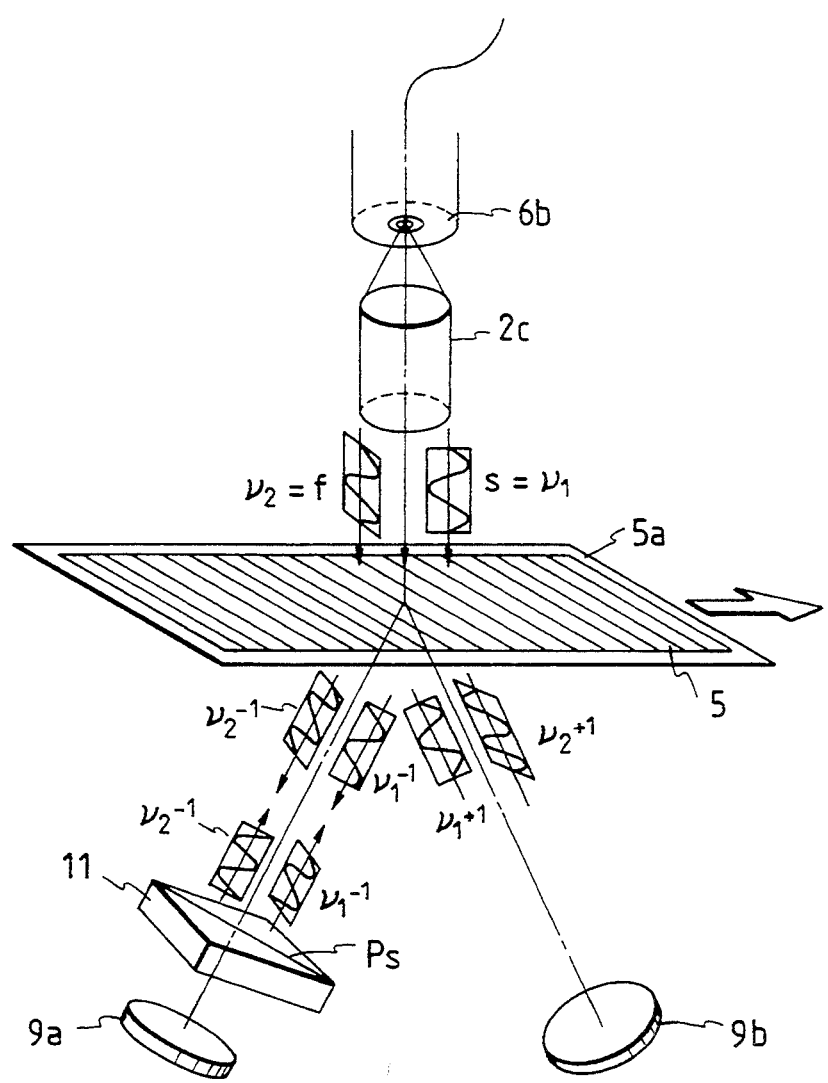
FIG. 13 is an illustration when a portion of FIG. 11 is modified.

(4-C) The two diffracted light beams obtained from the minute grating array (diffraction grating) provided on the scale are not restricted to reflected type diffracted lights, but may be transmitted type diffracted light as shown in FIG. 13. FIG. 13 shows only the vicinity of the scale $5a$. In FIG. 13, the same elements as those shown in FIG. 11 are given the same reference characters.

(4-D) The light beam from the plane-of-polarization holding fiber 6 may first be divided into two light beams by the utilization of a prism having a dividing surface BS, and then may be caused to enter the minute grating array 5 of the scale $5a$.

Figure 14:
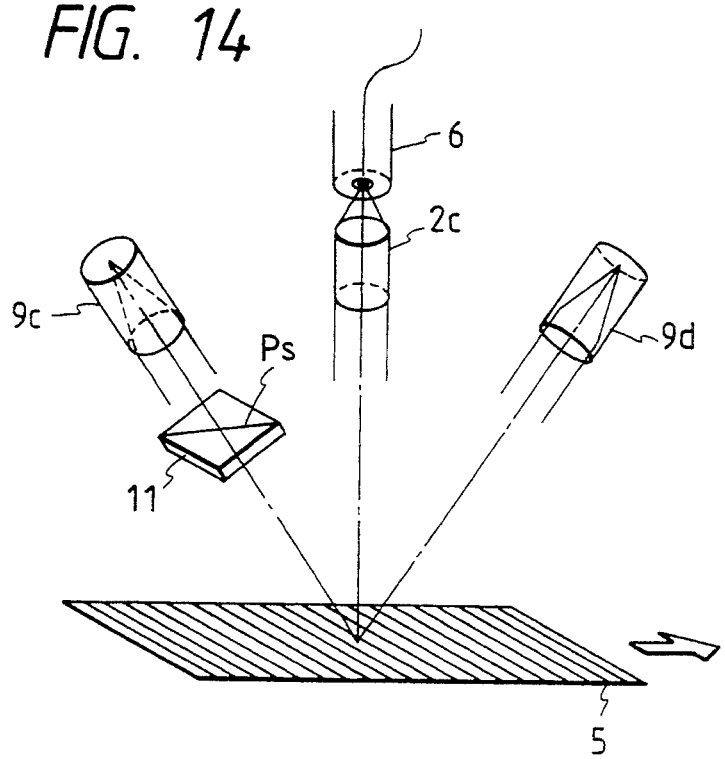
FIG. 14 is an illustration when a portion of FIG. 11 is modified.
Figure 15:
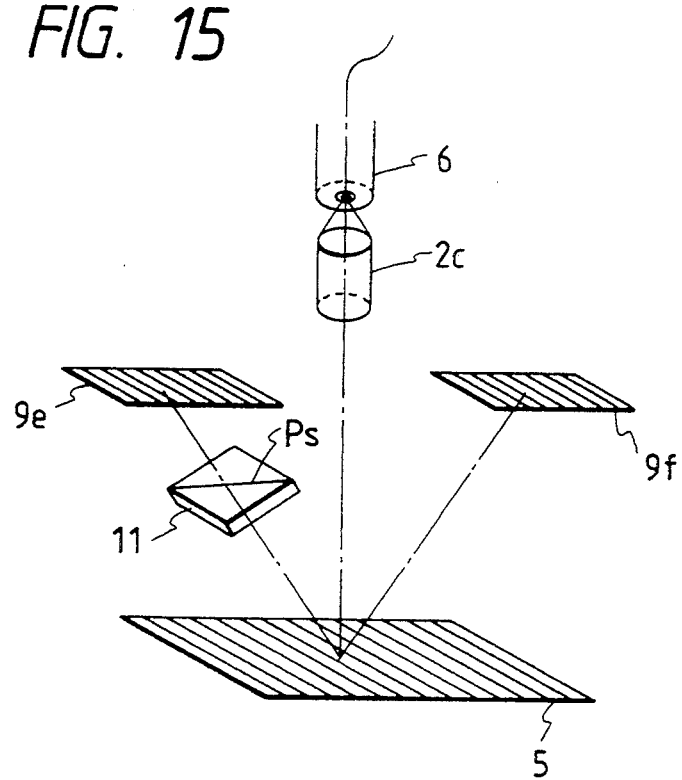
FIG. 15 is an illustration when a portion of FIG. 11 is modified.

(4-E) Cat's-eye optical elements 9c, 9d shown in FIG. 14, diffraction grating reflecting elements 9e, 9f shown in FIG. 15, corner cubes or the like may be used in lieu of the mirrors 9a, 9b. If this is done, the optical path deviation caused by the fluctuation of the wavelength of the light beam from the light source can be corrected. Where the diffraction grating reflecting elements 9e and 9f, if they are reflection type diffraction gratings, are periodic gratings of half of the pitch of the minute grating array 5 of the scale, the original optical path can be restored.

(4-F) As regards the structure of the cross-section of the polarization maintaining optical fiber, the elliptical core type, the PANDA type, etc. are applicable besides the so-called elliptical clad type shown.

(4-G) The minute grating array provided on the scale is not restricted to a straight one, but if use is made, for example, of a grating array comprising radial gratings recorded on a rotary disk, it can be intactly applied to a rotary encoder.

Figure 16:
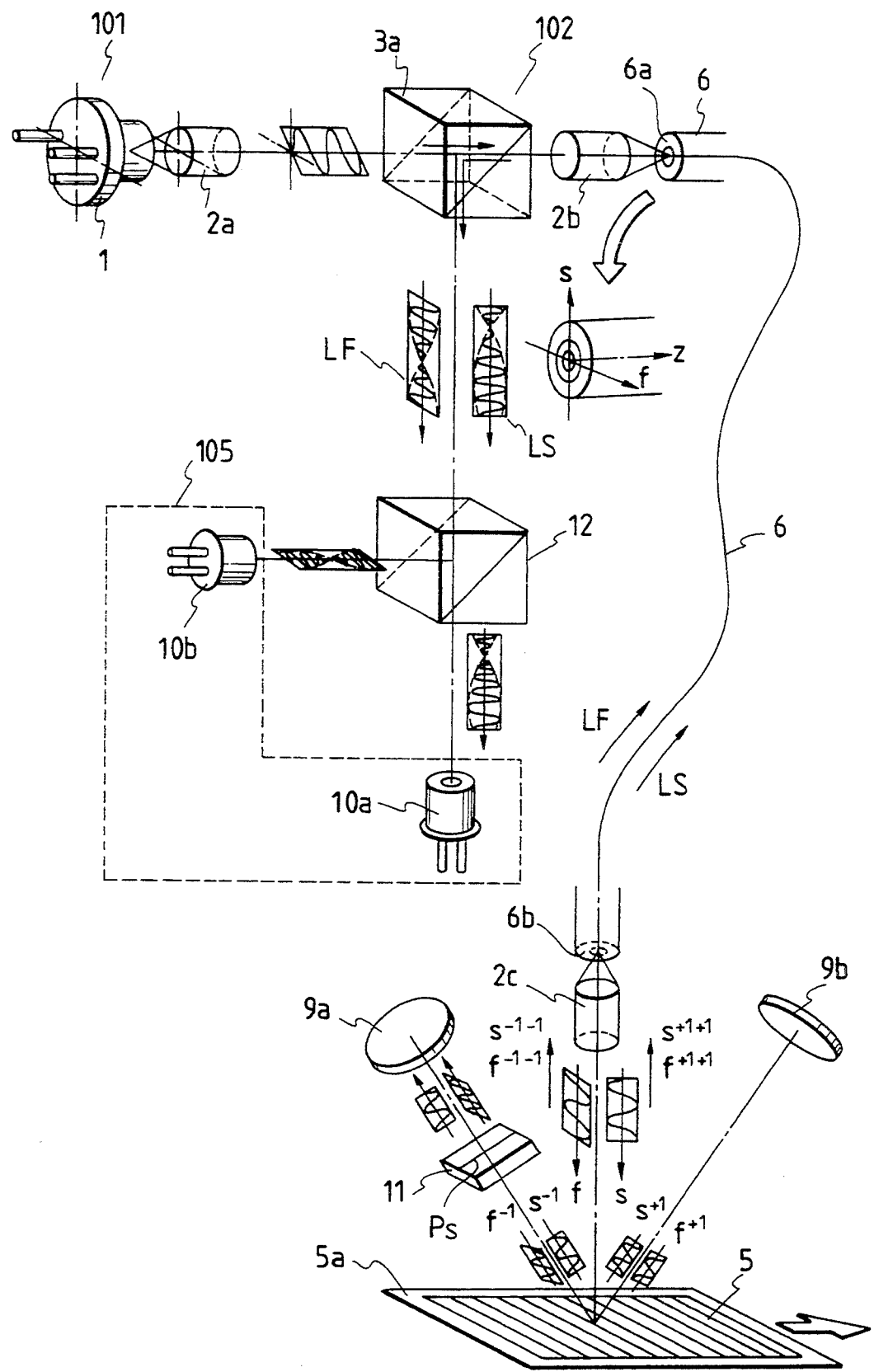
FIG. 16 is a schematic view of the essential portions of a fifth embodiment of the present invention.

FIG. 16 is a schematic view of the essential portions of a fifth embodiment of the present invention. In FIG. 16, arrows indicate the travel azimuths of the light beams, and sine-wave-like symbols indicate the planes of polarization. The reference numeral 101 denotes light source means having a light source 1 such as a laser or an LED emitting monochromatic light or coherent light.

A divergent light beam (in this case, linearly polarized light) emitted from the light source 1 is made into a substantially parallel light beam by a collimator lens 2a, is transmitted through a non-polarizing beam splitter 3a and enters a coupling lens 2b. The light beam from the coupling lens 2b enters a first end surface (entrance surface) 6a of a plane-of-polarization holding fiber 6. At this time, alignment is effected so that the angle formed between the optical axes (x-axis and f-axis) of the plane-of-polarization holding fiber 6 and the plane of polarization of the incident light beam may be about 45° as shown in FIG. 16.

The light beam emerging from a second end surface (exit surface) 6b of the plane-of-polarization holding fiber 6 is a light beam having an s-axis component (polarized component s) and an f-axis component (polarized component f). The light beam from the exit surface 6b of the plane-of-polarization holding fiber 6 is made into a substantially parallel light beam by a coupling lens 2c and enters a minute grating array 5 comprising a diffraction grating on a scale 5a.

The elements 2a, 3a, 2b, 6 and 2c each constitute one element of optical means 102 for causing the light beam from the light source means 101 to enter the scale 5a.

Of a plurality of diffracted light beams created from the minute grating array 5, for example ±1st-order diffracted light beams are reflected by mirrors 9a and 9b, are returned to the original optical path and are again caused to enter the minute grating array 5 of the scale 5a.

The design is made such that at this time, a $\frac{1}{8}$ wavelength plate 11 is disposed in one optical path so that of the diffracted lights from the minute grating array 5, the deviation of the length of the optical path between the polarized component s and the polarized component f may correspond to a $\frac{1}{8}$ wavelength. The diffracted lights are reciprocated through the $\frac{1}{8}$ wavelength plate 11, thereby giving a deviation of the length of the optical path corresponding to a quarter wavelength. For example, in FIG. 16, the $\frac{1}{8}$ wavelength plate 11 is inserted into the optical path of the −1st-order diffracted light and the length of the optical path of linearly polarized light (s$^{-1}$) parallel to the s-axis is extended by an amount corresponding to a quarter wavelength (this corresponds to a phase delayed by $\pi/2$).

Of the +1st-order diffracted light, the phase of linearly polarized light (s$^{+1}$) parallel to the s-axis = $2\pi \cdot 1 \cdot X/P$, The phase of linearly polarized light (f$^{+1}$) parallel to the f-axis = $2\pi \cdot 1 \cdot X/P$, and of the −1st-order diffracted light, the phase of linearly polarized light (s$^{-1}$) parallel to the s-axis = $-2\pi \cdot 1 \cdot X/P + \pi/2$ The phase of linearly polarized light (f$^{-1}$) parallel to the f-axis = $-2\pi \cdot 1 \cdot X/P$.

These four light beams are reflected by mirrors 9a and 9b and are again diffracted by the minute grating array 5. Of these, only the +1st-order diffracted light (s$^{+1+1}$) and (f$^{+1+1}$) of the +1st-order diffracted light and the −1st-order diffracted light (s$^{-1-1}$) and (f$^{-1-1}$) of the −1st-order diffracted light enter the coupling lens 2c.

The four light beams (s$^{+1+1}$), (s$^{-1-1}$), (f$^{+1+1}$) and (f$^{-1-1}$) again caused to enter the second end surface 6b of the plane-of-polarization holding fiber 6 by the coupling lens 2c each assume a plane of polarization parallel to one of the s-axis and the f-axis. The phases of the respective light beams at this time are:

phase of (s$^{+1+1}$) = $4\pi \cdot 1 \cdot X/P$
phase of (s$^{-1-1}$) = $-4\pi \cdot 1 \cdot X/P + \pi/2$
phase of (f$^{+1+1}$) = $4\pi \cdot 1 \cdot X/P$
phase of (f$^{-1-1}$) = $-4\pi \cdot 1 \cdot X/P$ So, in the present embodiment, the light components of s and f planes of polarization are caused to interfere with each other. At this time, the light and shade signal IF of the f-polarized component of the first set of light beam f$^{+1+1}$ and light beam f$^{-1-1}$ is:

$$\begin{aligned}IF &= \{\sin(\omega t + 4\pi \cdot 1 \cdot X/P) + \sin(\omega t - 4\pi \cdot 1 \cdot X/P)\}^2 \\ &= \{2\sin(\omega t) \cdot \cos(4\pi \cdot 1 \cdot X/P)\}^2 \\ &= 4 \cdot \sin^2(\omega t) \cdot \cos^2(4\pi \cdot X/P) \\ &= 2 \cdot \sin^2(\omega t) \cdot \{\cos(8\pi \cdot X/P) + 1\} \\ &= 2 \cdot \sin^2(\omega t) \cdot \{1 + \cos(8\pi \cdot X/P)\}\end{aligned}$$

and thus, becomes a cosine-wave-like light and shade signal and four periods per movement by one pitch of the grating, and the light and shade signal IS of the s-polarized component of the second set of light beam s$^{+1+1}$ and light beam s$^{-1-1}$ is:

$$\begin{aligned}IS &= \{\sin(\omega t + 4\pi \cdot 1 \cdot X/P + \pi/2) + \\ &\quad \sin(\omega t - 4\pi \cdot 1 \cdot X/P)\}^2 \\ &= [\{\sin(\omega t) + \cos(\omega t)\} \cdot \{-\sin(4\pi \cdot X/P) + \\ &\quad \cos(4\pi \cdot X/P)\}]^2 \\ &= 2 \cdot \sin^2(\omega t + \pi/4) \cdot \{1 - \cos(8\pi \cdot X/P - \pi/2)\} \\ &= 2 \cdot \sin^2(\omega t + \pi/4) \cdot \{1 - \sin(8\pi \cdot X/P)\}\end{aligned}$$

and thus, becomes a sine-wave-like light and shade signal of four periods per movement by one pitch of the grating. As is apparent from the above expressions, the two light and shade signals IF and IS of the f-polarized components and the s-polarized component deviate by $\pi/2$ from each other in the timing of light and shade.

In the present embodiment, bright and dark signal light beams LF and LS based on these two bright and dark signals IF and IS are caused to enter the polarization maintaining optical fiber 6 and are propagated therethrough so that their planes of polarization may be parallel to the optical axes (s-axis and f-axis) of the polarization maintaining optical fiber 6. That is, the design is made such that the two light and shade signal light beams LF and LS are propagated through the polarization maintaining optical fiber 6 independently (without mutual interference).

The two light and shade signal light beams LF and LS emerging from the first end surface 6a of the polarization maintaining optical fiber 6 are made into substantially parallel light beams by the coupling lens 2b with their planes of polarization kept orthogonal to each other, and are reflected by the non-polarizing beam splitter 3a. These two light and shade signal light beams LF and LS are separated from each other for each polarized component by a polarizing beam splitter 12, whereby the two original light and shade signal light beams LF and LS are taken out.

These light and shade signal light beams are converted into electrical signals by photoelectric elements 10a and 10b as photoelectric converting means 105, and after the amplitudes thereof are amplified, a two-phase signal as an encoder is output.

In the present embodiment, movement information such as the amount and direction of movement of the scale 5a is detected by the use of the signals obtained from the photoelectric converting means 105 (photoelectric elements 10a and 10b) at this time.

As described above, in the present embodiment, a plane-of-polarization holding fiber and each element are appropriately constructed, that is, when two diffracted light beams created from the minute grating array of the scale are caused to interfere with each other on each plane of polarization to create two sets of bright and dark signals IF and IS (given the deviation of the timing of the bright and dark) and are transmitted through the polarization maintaining optical fiber 6, the two bright and dark signal light beams LF and LS are caused to enter the plane-of-polarization holding fiber 6 and are transmitted therethrough so that their planes of polarization may be parallel to one of the optical axes (f-axis and s-axis) of the polarization maintaining optical fiber 6 so that the light and shade signal light beams LF and LS may not interfere with each other to disturb the bright and dark signals, whereby the movement information of the scale 5a is detected highly accurately while the simplification of the entire apparatus is achieved.

In the above-described fifth embodiment of the present invention, the following changes of the elements are equally applicable.

(5-A) One can utilize a combination of diffracted light of the other orders than ±1st-order diffracted light as the diffracted light from the minute grating array on the scale.

(5-B) A mirror type beam splitting means having a similar function in liue of the prism-like beam splitter can be used.

Figure 17:
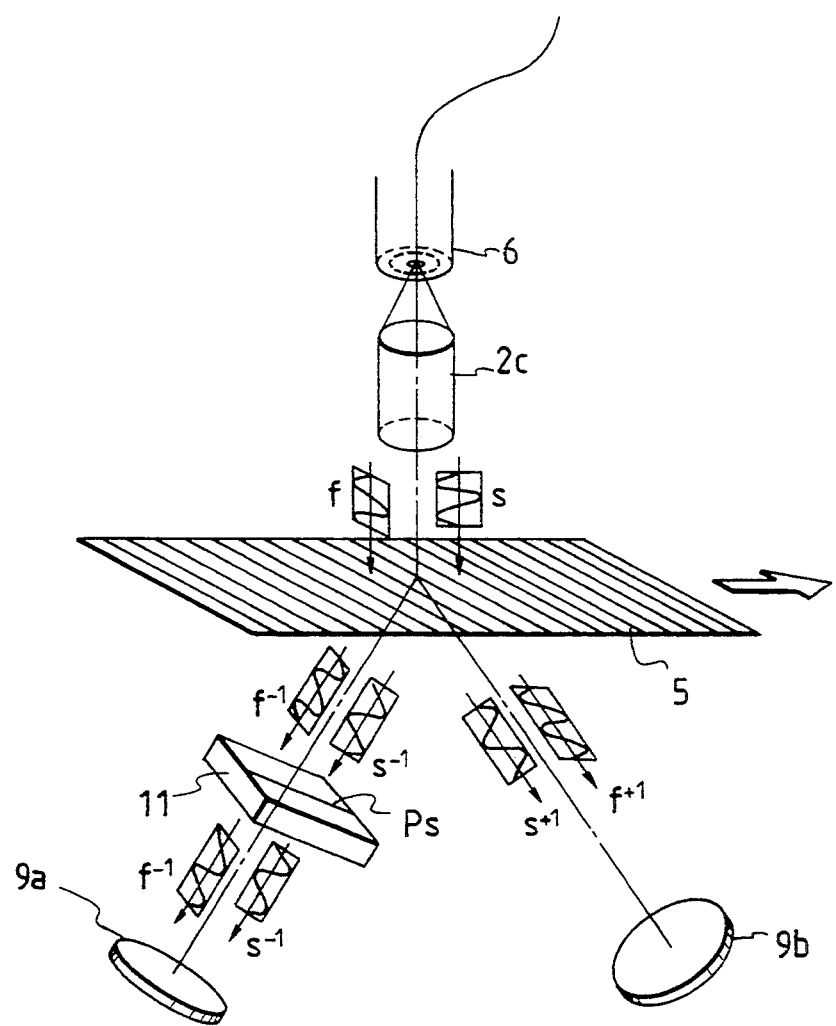
FIG. 17 is an illustration when a portion of FIG. 16 is modified.

(5-C) The two diffracted light beams obtained from the minute grating array (diffraction grating) provided on the scale are not restricted to reflected type diffracted light, but may be transmitted type diffracted lights as shown in FIG. 17. FIG. 17 shows only the vicinity of the scale 5a, and corresponds to FIG. 16. In FIG. 17, the same elements as those shown in FIG. 16 are given the same reference characters.

Figure 18:
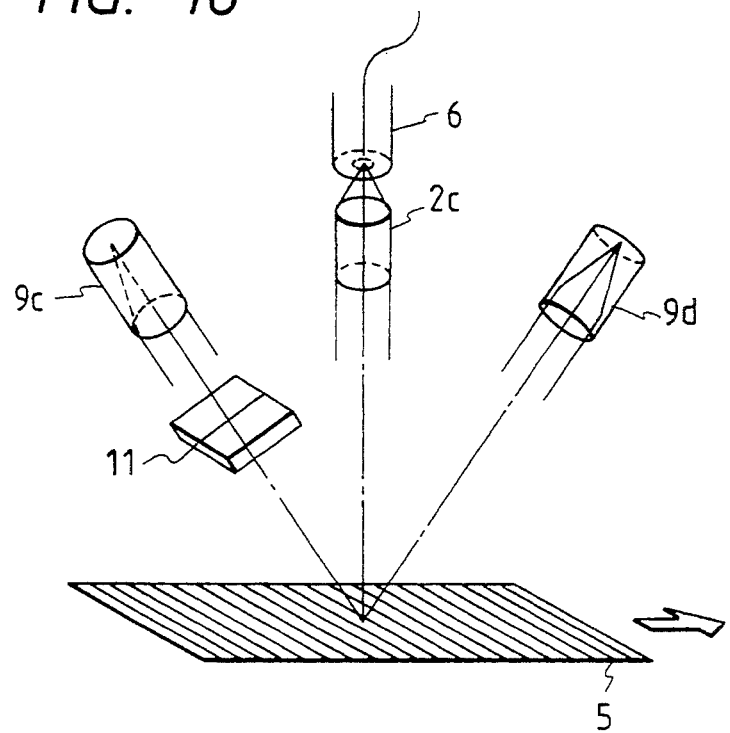
FIG. 18 is an illustration when a portion of FIG. 16 is modified.
Figure 19:
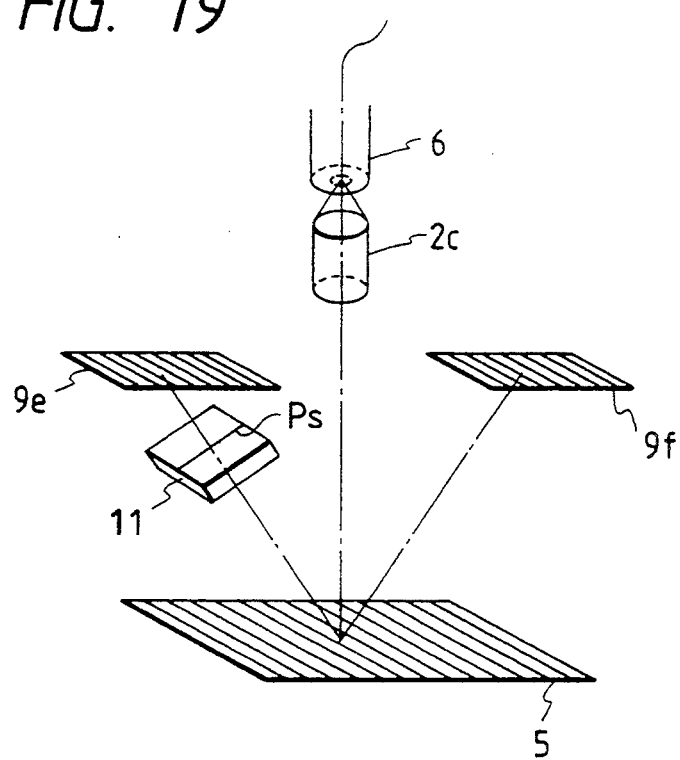
FIG. 19 is an illustration when a portion of FIG. 16 is modified.

(5-D) Cat's-eye optical elements 9c, 9d shown in FIG. 18, diffraction grating reflecting elements 9e, 9f shown in FIG. 19, corner cubes or the like may be used in lieu of the mirrors 9a, 9b.

If this is done, the optical path deviation caused by the fluctuation of the wavelength of the light beam from the light source can be corrected. Where the diffraction grating reflecting elements 9e and 9f, if they are reflection type diffraction gratings, are periodic gratings of half of the pitch of the minute grating array 5 of the scale, the original optical path can be restored.

(5-E) As regards the structure of the cross-section of the polarization maintaining optical fiber, the elliptical core type, the PANDA type, etc. are applicable besides the so-called elliptical clad type shown.

(5-F) The minute grating array provided on the scale is not restricted to a straight one, but if use is made, for example, of a grating array comprising radial gratings recorded on a rotary disk, it can be intactly applied to a rotary encoder.

(5-G) In lieu of the ⅛ wavelength plate, use may be made of any other wavelength plate which can impart a phase difference of 90° between two-phase signals, or a crystal optical element having a similar function.

Figure 20:
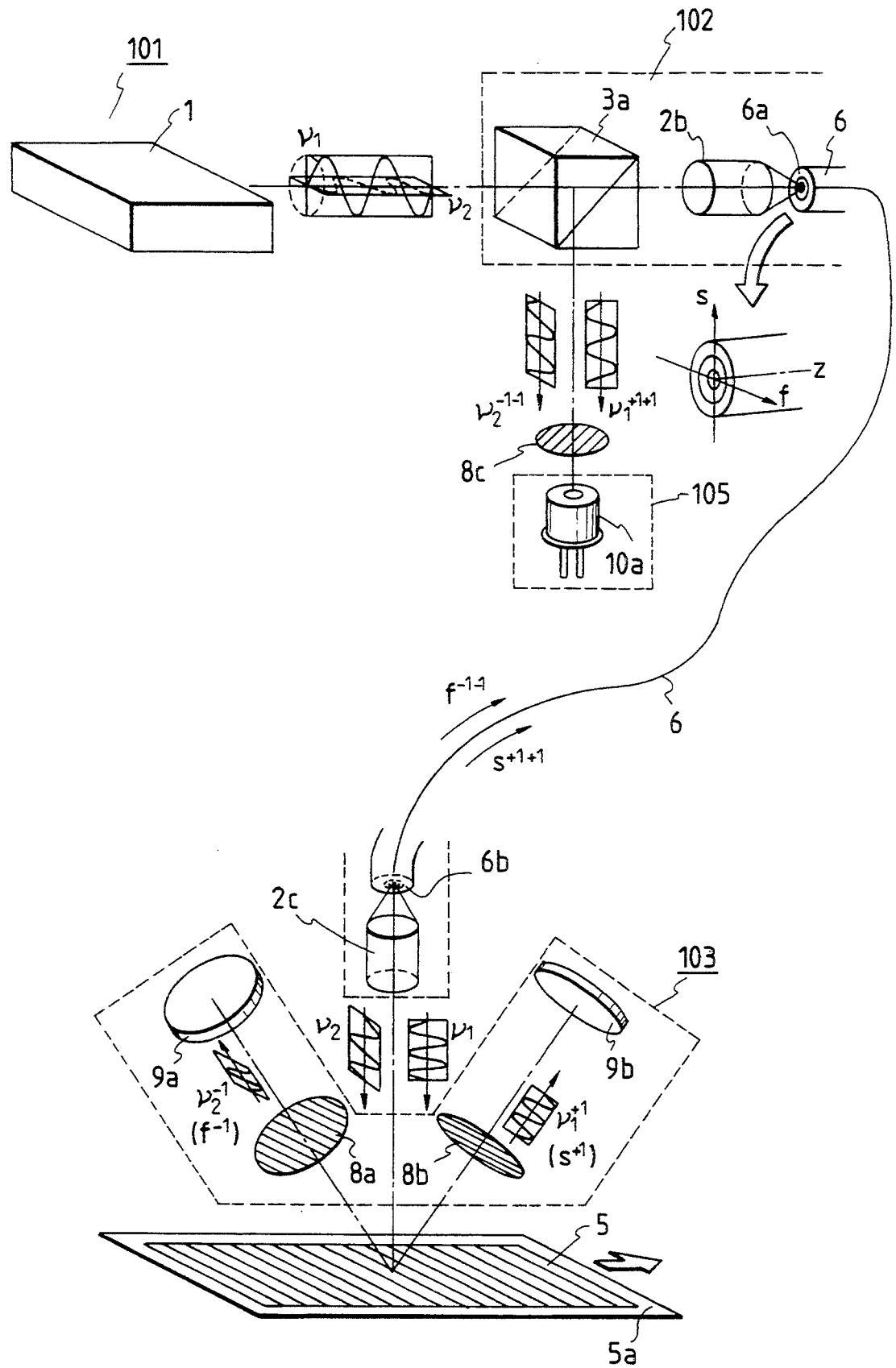
FIG. 20 is a schematic view of the essential portions of a sixth embodiment of the present invention.

FIG. 20 is a schematic view of the essential portions of a sixth embodiment of the present invention. In FIG. 20, arrows indicate the travel azimuths of light beams, and sine-wave-like symbols indicate the planes of polarization. The reference numeral 101 designate light source means having a light source 1 such as a two-frequency oscillating laser oscillating light beams of at least two frequencies (wavelengths).

Two light beams ($\nu_1$ and $\nu_2$) of different frequencies substantially parallel to each other and having their planes of polarization made orthogonal to each other are emitted from the light source 1 in overlapping relationship with each other. These two light beams ($\nu_1$ and $\nu_2$) are transmitted through a non-polarizing beam splitter 3a, are condensed by a coupling lens 2b and enter a first end surface (entrance surface) 6a of a plane-of-polarization holding fiber 6. At this time, alignment is effected so that the optical axes (s-axis and f-axis) of the plane-of-polarization holding fiber 6 and the planes of polarization of the two light beams ($\nu_1$ and $\nu_2$) may coincide with one another. (Either combination will do.)

The design is made such that the s-axis component light beam and f-axis component light beam of the light beams emerging from a second end surface (exit surface) 6b of the plane-of-polarization holding fiber 6 correspond to the light beam $\nu_1$ and the light beam $\nu_2$, respectively. The two light beams ($\nu_1$ and $\nu_2$) from the exit surface 6b of the plane-of-polarization holding fiber 6 are made into substantially parallel light beams by a coupling lens 2c, and enter a minute grating array 5 comprising a diffraction grating on a scale 5a.

The elements 3a, 2b, 6 and 2c each constitute one element of optical means 102 for causing the light beams from the light source means 101 to enter the scale 5a.

Of a plurality of diffracted light created from the minute grating array 5, for example, ±1st-order diffracted light ($\nu_1^{+1}$ and $\nu_2^{-1}$) are reflected by mirrors 9a and 9b through polarizing plates 8a and 8b, are returned to the original optical path and are again caused to enter the minute grating array 5 of the scale 5a.

The design is made such that at this time, by the polarizing plates 8a and 8b, the +1st-order diffracted light is made into linearly polarized light $(s^{+1}) = (\nu_1^{+1})$ parallel to the s-axis and the −1st-order diffracted light is made into linearly polarized light $(f^{-1}) = (\nu_2^{-1})$ parallel to the f-axis, as shown in 1 FIG. 20. The elements 8a, 8b, 9a and 9b constitute the elements of a detecting optical system 103.

These two light beams ($s^{+1}$ and $f^{-1}$) are again diffracted by the minute grating array 5 and only the +1st-order diffracted light $(s^{+1+1})=(\nu_1^{+1+1})$ of the +1st-order diffracted light and the −1st-order diffracted light $(f^{-1-1})=(\nu_2^{-1-1})$ of the −1st-order diffracted light enter the coupling lens 2c. The two light beams $(s^{+1+1})$ and $(f^{-1-1})$ again caused to enter the polarization maintaining optical fiber 6 by the coupling lens 2c assume planes of polarization parallel to the s-axis and the f-axis, respectively, and propagate through the polarization maintaining optical fiber 6 independently (without mutual interference).

The two light beams emerging from the first end surface 6a of the polarization maintaining optical fiber 6 are made into substantially parallel light beams by the coupling lens 2b with their planes of polarization kept orthogonal to each other, are reflected by the non-polarizing beam splitter 3a, are transmitted through a polarizing plate (analyzer) 8c set so as to have a transmission characteristic in the azimuth of 45° with respect to the polarization azimuths of the two light beams $(\nu_1^{+1+1})$ and $(\nu_2^{-1-1})$ and cause an interference phenomenon between the common polarized components of the two light beams. They are then converted into a light and shade signal light beam repeating light and shade at the difference frequency between the oscillation frequencies of the two light beams.

This light and shade signal light beam is converted into an electrical signal by a photoelectric element 10a as photoelectric converting means 105, and after the amplitude thereof is amplified, a modulated phase singal as an encoder utilizing heterodyne interference is output.

In the present embodiment, by the use of the signal obtained from the photoelectric converting means 105 (photoelectric element 10a) at this time, the phase difference between it and for example, an electrically produced signal of a frequency $|\nu_1-\nu_2|$ is detected to thereby detect movement information such as the amount and direction of movement of the scale 5a.

As described above, in the present embodiment, a two-frequency oscillating laser, a polarization maintaining optical fiber and each element are appropriately constructed, that is, when two diffracted light beams of different frequencies and different diffraction orders created from the minute grating array of the scale are transmitted through the polarization maintaining optical fiber, the two light beams are caused to enter the polarization maintaining optical fiber and are transmitted therethrough with their planes of polarization made orthogonal to each other so that the two light beams may not interfere with each other to provide a light and shade signal and further that the planes of polarization of the two diffracted lights may be parallel to one of the optical axes (f-axis and s-axis) of the polarization maintaining optical fiber, whereby the movement information of the scale 5a is detected highly accurately while the simplification of the entire apparatus is achieved.

Figure 21:
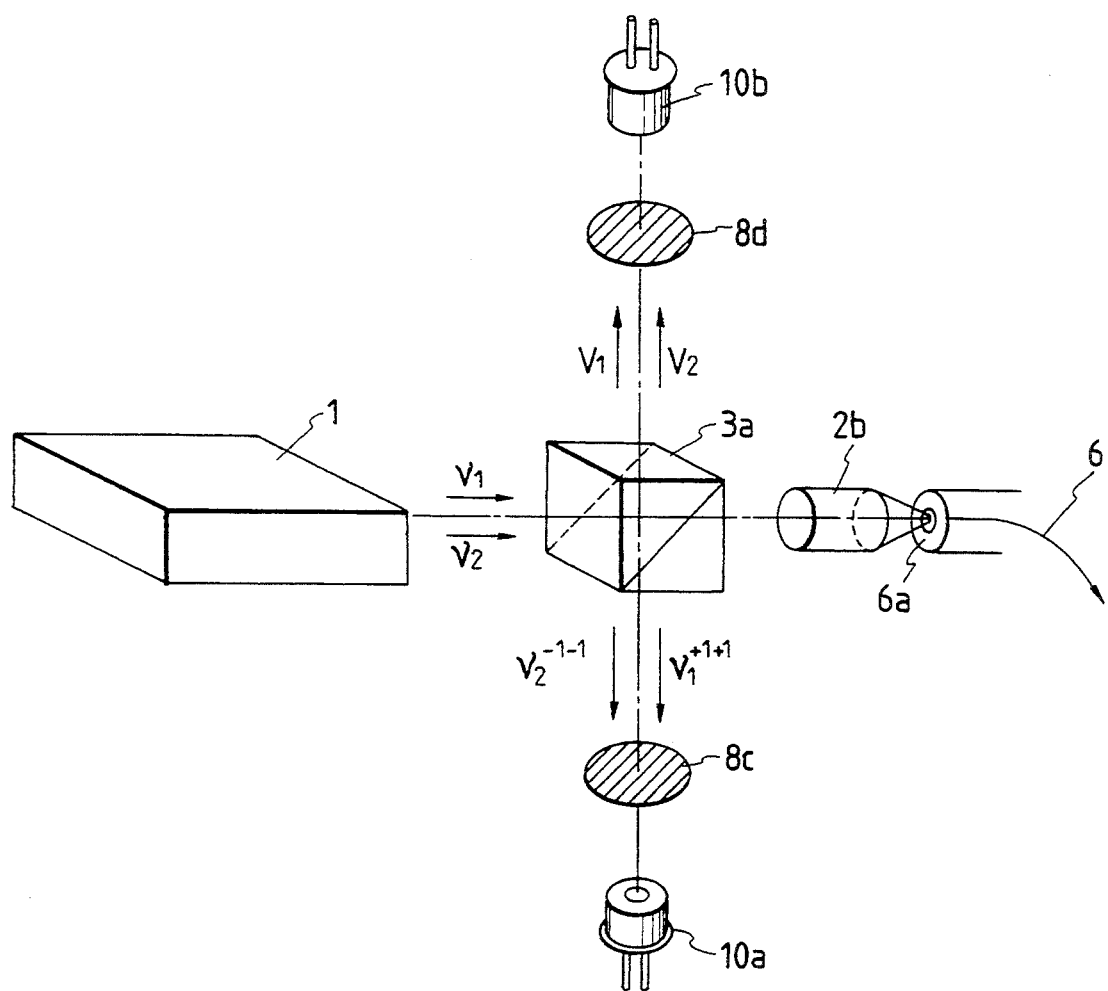
FIG. 21 is an illustration when a portion of FIG. 20 is modified.

In the present embodiment, as shown in FIG. 21, the reflected light beam from the non-polarization beam splitter 3a may be utilized as a reference light and shade signal (a signal not subjected to the phase modulation by the movement of the scale 5a=the difference signal between the oscillation frequencies of the two-frequency laser).

That is, as shown in FIG. 21, two light beams ($\nu_1$ and $\nu_2$) are transmitted through a polarizing plate (analyzer) 8d set so as to have a transmission characteristic at the azimuth of 45° with respect to the polarization azimuths of the two light beams, to thereby cause an interference phenomenon between the common polarized components of the two light beams. The two light beams ($\nu_1$ and $\nu_2$) are then converted into a light and shade signal light beam repeating light and shade at the difference frequency between the oscillation frequencies of the two light beams ($\nu_1$ and $\nu_2$).

This light and shade signal light beam is converted into an electrical signal by a photoelectric element 10b, and after the amplitude thereof is amplified, a reference phase signal as an encoder utilizing heterodyne interference may be output for use.

In the above-described sixth embodiment of the present invention, the following changes of the elements are equally applicable.

(6-A) One can utilize a combination of diffracted light of the other orders than the ±1st-order diffracted light as the diffracted light from the minute grating array on the scale.

(6-B) A mirror type beam splitting means having a similar function in lieu of the prism-like beam splitter can be used.

Figure 22:
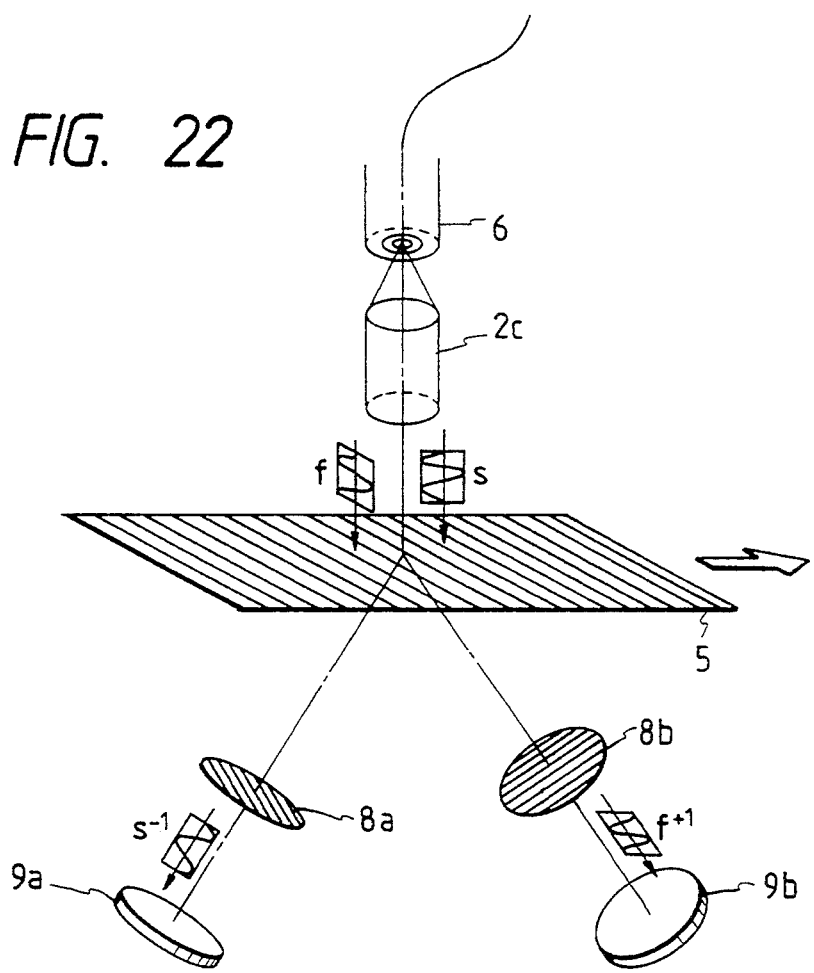
FIG. 22 is an illustration when a portion of FIG. 20 is modified.

(6-C) The two diffracted lights obtained from the minute grating array (diffraction grating) provided on the scale are not restricted to reflected type diffracted lights, but may be transmitted type diffracted light as shown in FIG. 22. FIG. 22 shows only the vicinity of the scale 5a. In FIG. 22, the same elements as those shown in FIG. 20 are given the same reference characters.

Figure 23:
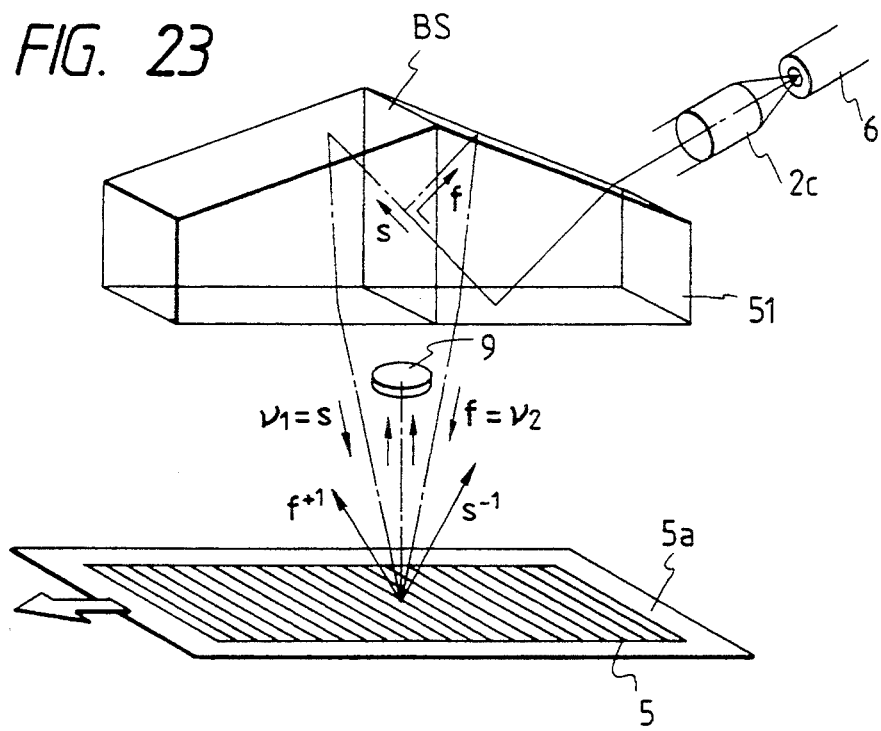
FIG. 23 is an illustration when a portion of FIG. 20 is modified.

(6-D) As shown in FIG. 23, the light beam from the polarization maintaining optical fiber 6 may first be divided into two light beams by the utilization of a prism 51 having a dividing surface BS, and then the two light beams may be caused to enter the minute grating array 5 of the scale 5a.

FIG. 23 is a view developed on the basis of the optical system of the sixth embodiment. In FIG. 23, the two light beams ($\nu_1$ and $\nu_2$) emerging from the exit surface 6b of the polarization maintaining optical fiber 6 correspond to the azimuths of the optical axes (s-axis and f-axis) of the polarization maintaining optical fiber 6.

So, by the utilization of the dividing surface BS of the prism 51 as shown on which polarizing beam splitter film is deposited by evaporation, for example, the reflected light beam on the dividing surface BS and the light beam transmitted through the dividing surface BS are separately taken out as an f-axis component light beam ($\nu_2$) and an s-axis component light beam ($\nu_1$), respectively. After the +1st-order diffraction or the −1st-order diffraction, those light beams are returned to the original optical path to thereby obtain two light beams of similar properties.

Where ordinary non-polarizing beam splitter film is used in lieu of the polarizing film, polarizing plates orthogonal to each other can be disposed in the optical path applied from the prism of FIG. 23 to the scale so that the s-axis component and the f-axis component can be selected.

Instead of the common mirror 9 being disposed at the positions of the diffracted lights $s^{-1}$ and $f^{+1}$, respective mirrors may be disposed at the positions of the diffracted lights $s^{+1}$ and $f^{-1}$.

Figure 24:
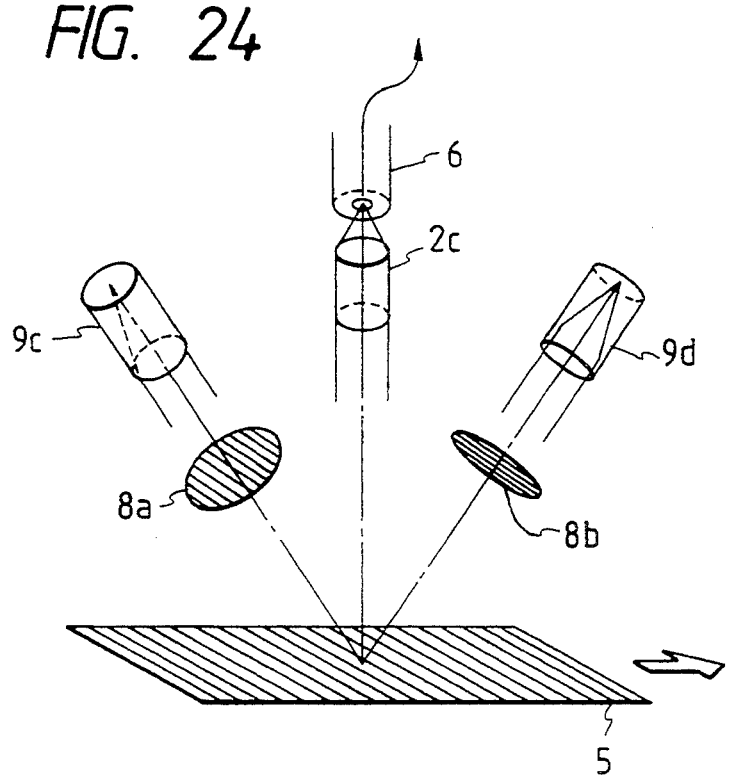
FIG. 24 is an illustration when a portion of FIG. 20 is modified.
Figure 25:
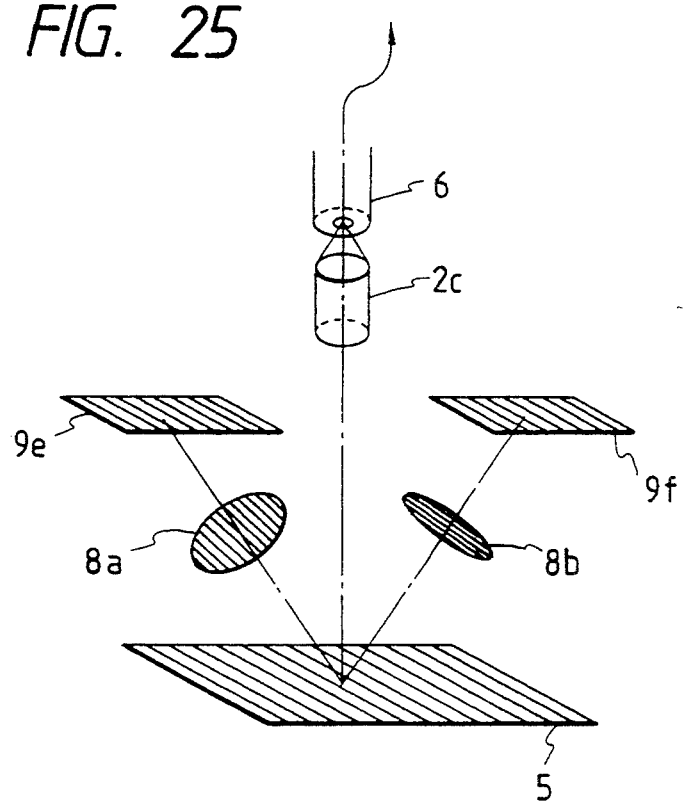
FIG. 25 is an illustration when a portion of FIG. 20 is modified.

(6-E) Cat's-eye optical elements 9c, 9d shown in FIG. 24, diffraction grating reflecting elements 9e, 9f shown in FIG. 25, corner cubes or the like may be used in lieu of the mirrors 9a, 9b.

If this is done, the deviation of the optical path caused by the fluctuation of the wavelength of the light beam from the light source can be corrected. Where the diffraction grating reflecting elements 9e and 9f, if they are reflection type diffraction gratings, are periodic gratings of half of the pitch of the minute grating array 5 of the scale, the original optical path can be restored.

(6-F) As regards the structure of the cross-section of the polarization maintaining optical fiber, the elliptical core type, the PANDA type, etc. are applicable besides the so-called elliptical clad type.

(6-G) The minute grating array provided on the scale is not restricted to a straight one, but if use is made, for example, of a grating array comprising radial gratings recorded on a rotary disk, it can be intactly applied to a rotary encoder.

Figure 26:
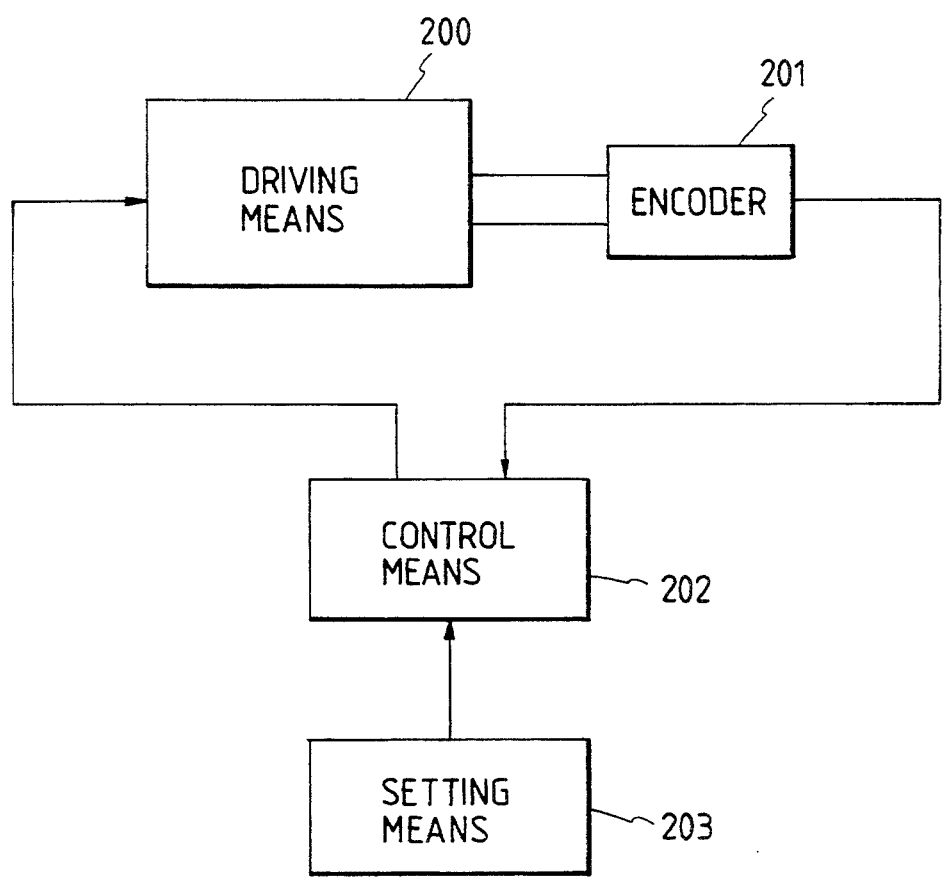
FIG. 26 illustrates a driving system using the encoder of the present invention.

FIG. 26 shows an example of the application of the encoder of the present invention, and more particularly shows the system construction of a driving system using the encoder. An encoder 201 is mounted on the driving output portion of driving means 200 having a drive source such as a motor, an actuator or an engine, or the moving portion of an object driven (specifically, for example, a diffraction grating is mounted on a movable portion and the optical system portion of any of the above-described embodiments is mounted on a fixed portion), whereby the displacement state such as the amount and speed of displacement is detected. The detection output of this encoder 201 is fed back to control means 202, which transmits a driving signal to the driving means 200 so as to bring about a state set by setting means 203. By constructing such a feedback system, the driving state set by the setting means 203 can be provided. Such a driving system can be widely applied not only to business machines such as typewriters, printers, copying machines and facsimile apparatuses, image instruments such as cameras and video apparatuses, information recording-reproducing apparatuses, robots, machine tools, manufacturing apparatuses and transportation machines, but also to various apparatuses having driving means.

(7-A) As previously described, a polarization maintaining optical fiber and each element are appropriately constructed, whereby there can be achieved an encoder in which the light beam from the light source means is efficiently directed to any position and which can detect the movement information of the scale (moving object) highly accurately while the simplification of the entire apparatus is achieved without being affected by a high heat environment.

Particularly in the above-described embodiments, the encoder is constructed by the use of a plane-of-polarization holding fiber, and the fiber is made to have only one connected portion, whereby the reliability of transmission and the simplification of the entire apparatus are made easy to achieve.

(7-B) The heterodyne interference method is utilized and a polarization maintaining optical fiber and each element are appropriately constructed, whereby there can be achieved an encoder in which the light beam from the light source means is efficiently directed to any position so that the loss of light in the optically coupled portion may become small and which can detect the movement information of the scale (moving object) highly accurately while the simplification of the entire apparatus is achieved without being affected by heat environment.

Also, the signal can be transmitted as a heterodyne signal and therefore, the loss of the information of the signal caused by disturbance and the instability of the connected portion of the optical fiber is very small and thus, an encoder of high accuracy and high resolving power becomes realizable.

Further, the two light beams $(\nu_2+1+1)-(\nu_1-1-1)+1$ and $(\nu_2-1-1)-(\nu_1+1+1)$ which create heterodyne signals of two phases are subjected to equal amounts of frequency modulation in opposite directions and therefore, the difference between the two signals is taken to thereby obtain double sensitivity and thus, high resolving power can be easily achieved.

Besides, in the above-descried embodiments, the encoder is constructed by the use of a polarization maintaining optical fiber, and the fiber is made to have only one connected portion, whereby the reliability of transmission and the simplification of the entire apparatus are made easy to achieve.

What is claimed is:

1. An apparatus for effecting a measurement of relative movement by the use of a diffraction grating, comprising:
   a light beam generating portion generating a light beam including light wave components having planes of polarization orthogonal to each other;
   an interference optical system for directing the light beam from said light beam generating portion to the diffraction grating, the light beam directed by said interference optical system being diffracted by the diffraction grating to thereby at least create two diffracted light beams of different orders, said interference optical system causing the polarization condition of at least one of the two diffracted light beams to vary and causing said two diffracted light beams to to enter said diffraction grating again, so that two rediffracted light beams diffracted by the diffraction grating are directed in the same direction and are superposed; and
   a detecting system for causing said two rediffracted light beams to interfere with each other and detecting the interfering light beam, the relative movement of said diffraction grating and said interference optical system being measured by the detection by said detecting system;
   said interference optical system having in at least a portion of the optical path from the diffraction grating to said detecting system a polarization maintaining optical fiber for propagating the two rediffracted light beams therethrough.

2. An apparatus according to claim 1, wherein said polarization maintaining optical fiber has an f-axis and an s-axis, wherein the f-axis and s-axis of said polarization maintaining optical fiber are disposed so as to be parallel to or form 45° with respect to the directions of the planes of polarization of the two rediffracted light beams created by the diffraction grating.

3. An apparatus according to claim 1, wherein said polarization maintaining optical fiber has an f-axis and an s-axis, wherein the f-axis and s-axis of said polarization maintaining optical fiber and the planes of polarization of the two rediffracted light beams form 45° therebetween, and the following condition is satisfied:

$$0.9 < (\tfrac{1}{4}+n)\cdot\lambda_0/(\beta\cdot L) < 1.1,$$

where L is the length of said polarization maintaining optical fiber, $\beta$ is the mode refractive index of said plane-of-polarization holding fiber, $\lambda_0$ is the wavelength of the light beam from said light beam generating portion, and n is an integer.

4. An apparatus according to claim 1, wherein the two rediffracted light beams are of different frequencies, wherein said detecting system forms a beat signal from the interference light beam by the two diffracted lights, and wherein the relative movement of the diffraction grating and said interference optical system is measured from the phase difference of the beat signal from a predetermined signal.

5. An apparatus according to claim 4, wherein the predetermined signal is formed from the interference light beam of lights of different frequencies from said light beam generating portion.

6. An apparatus according to claim 4, wherein the predetermined signal is formed from the interference light of two rediffracted light beams differing in frequency from each other and discrete from the two rediffracted light beams from the diffraction grating.

7. An apparatus according to claim 1, wherein said polarization maintaining optical fiber serves also as optical means for forming the optical path from said light beam generating portion to the diffraction grating.

8. An apparatus according to claim 7, wherein said interference optical system has an optical element for separating emergent light from said polarization maintaining optical fiber in each plane of polarization, between that end of a plane-of-polarization holding fiber which is adjacent to the diffraction grating and the diffraction grating, and wherein said optical element combines the two rediffracted light beams and directs them to said polarization maintaining optical fiber.

9. An apparatus according to claim 1, wherein said interference optical system creates from the two rediffracted light beams a second interference light beam forming a light intensity signal differing in phase from said interference light beam, wherein said detecting system further detects said second interference light beam, and the amount and direction of relative movement of said interference optical system and the diffraction grating are detected by the detection of said two interference light beams.

10. A driving system comprising:
a diffraction grating provided on one of two objects moving relative to each other;
a measuring system for measuring the relative movement of the two objects moving relative to each other, said measuring system including:
 (1) a light beam generating portion generating a light beam including light wave components having planes of polarization orthogonal to each other;
 (2) an interference optical system provided on the other of the two objects moving relative to each other, said interference optical system directing the light beam from said light beam generating portion to the diffraction grating, the light beam directed by said interference optical system being diffracted by the diffraction grating to thereby at least create two diffracted light beams of different orders, said interference optical system causing the polarization condition of at least one of the two diffracted light beams to vary and causing said two diffracted light beams to enter said diffraction grating again, so that two rediffracted light beams diffracted by the diffraction grating are directed in the same direction and are superposed; and
 (3) a detecting system for causing said two rediffracted light beams to interfere with each other and detecting the interfering light beam, the relative movement of said diffraction grating and said interference optical system being measured by the detection by said detecting system;
said interference optical system having in at least a portion of the optical path from said diffraction grating to said detecting system a polarization maintaining optical fiber for propagating the two rediffracted light beams therethrough;
a driving system for driving said two objects relative to each other; and
a control system for controlling said driving system on the basis of the result of the measurement by said measuring system.

* * * * *

UNITED STATES PATENT AND TRADEMARK OFFICE
CERTIFICATE OF CORRECTION

PATENT NO. : 5,436,724
DATED : July 25, 1995
INVENTOR(S) : KOH ISHIZUKA, et al.

It is certified that error appears in the above-indentified patent and that said Letters Patent is hereby corrected as shown below:

COLUMN 1

Line 48, "lights" should read --light beams--.

COLUMN 2

Line 53, "time," should read --time.--.

COLUMN 5

Line 60, "downs" should read --decreases--.

COLUMN 7

Line 14, "devation" should read --deviation--.
Line 28, ".maintaining" should read --maintaining--.

COLUMN 13

Line 44, "($S^{31\ 1}$)," should read --($S^{-1}$),--.
Line 45, "element." should read --element--.

UNITED STATES PATENT AND TRADEMARK OFFICE
CERTIFICATE OF CORRECTION

PATENT NO. : 5,436,724

DATED : July 25, 1995

INVENTOR(S) : KOH ISHIZUKA, et al.

It is certified that error appears in the above-indentified patent and that said Letters Patent is hereby corrected as shown below:

COLUMN 14

Line 50, "a" should be deleted.

COLUMN 18

Line 39, "arears" should read --areas--.

COLUMN 21

Line 59, "lights" should read --light--.

COLUMN 26

Line 36, "to to" should read --to--.

Signed and Sealed this

Fourteenth Day of November, 1995

Attest:

BRUCE LEHMAN

*Attesting Officer*  *Commissioner of Patents and Trademarks*